United States Patent [19]

Suu et al.

[11] Patent Number: 5,313,203
[45] Date of Patent: May 17, 1994

[54] CODING APPARATUS AND METHOD FOR CODING INFORMATION SYMBOL STRINGS BY ASSIGNING FIXED LENGTH CODES THERETO

[75] Inventors: Hiroshi Suu, Chigasaki; Tomoo Yamakage, Kawasaki; Katsumi Takahashi, Oosaka, all of Japan

[73] Assignee: Kabushiki Kaisha Toshiba, Kawasaki, Japan

[21] Appl. No.: 935,872

[22] Filed: Aug. 26, 1992

[30] Foreign Application Priority Data

Aug. 26, 1991 [JP] Japan .................................. 3-213626
Sep. 30, 1991 [JP] Japan .................................. 3-278712
Mar. 16, 1992 [JP] Japan .................................. 4-55963

[51] Int. Cl.$^5$ ............................................... H03M 7/40
[52] U.S. Cl. ........................................ 341/50; 341/55; 341/106; 341/67
[58] Field of Search ............... 341/50, 52, 55, 65, 341/67, 106, 107

[56] References Cited

U.S. PATENT DOCUMENTS 4,276,544 6/1981 Iinuma .................................. 341/65
4,644,545 2/1987 Gershenson ........................... 341/51
5,148,271 9/1992 Kato et al. ........................... 358/133
5,175,545 12/1992 Uchiyama et al. ................... 341/59

OTHER PUBLICATIONS

Jelinek et al., *On Variable-Length-to-Block Coding*, IEEE Transaction on Information Theory, vol. IT-18, No. 6, Nov. 1972.

*Primary Examiner*—Howard L. Williams
*Attorney, Agent, or Firm*—Oblon, Spivak, McClelland, Maier & Neustadt

[57] ABSTRACT

A coding apparatus for coding symbolized information signals includes a coding unit for assigning fixed-length code words to a plurality of information symbol strings consisting of at least one type of a given number of information symbols and coding the information signals on the basis of this assignment, a control information adding unit for adding control information containing information for performing predetermined processing to the code words, and a transmitting/recording unit including at least one of a unit for transmitting and a unit for recording the code words added with the control information.

18 Claims, 44 Drawing Sheets

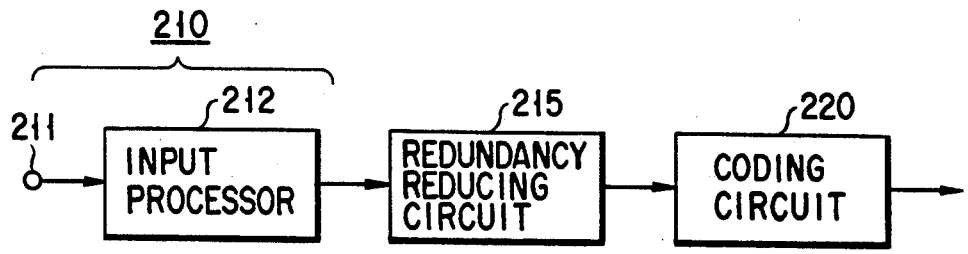
FIG. 6
| SYMBOL | GENERATION PROBABILITY | HUFFMAN CODE LENGTH |
|---|---|---|
| S0 | 0.7 | 1 |
| S1 | 0.2 | 2 |
| S2 | 0.1 | 2 |
FIG. 7
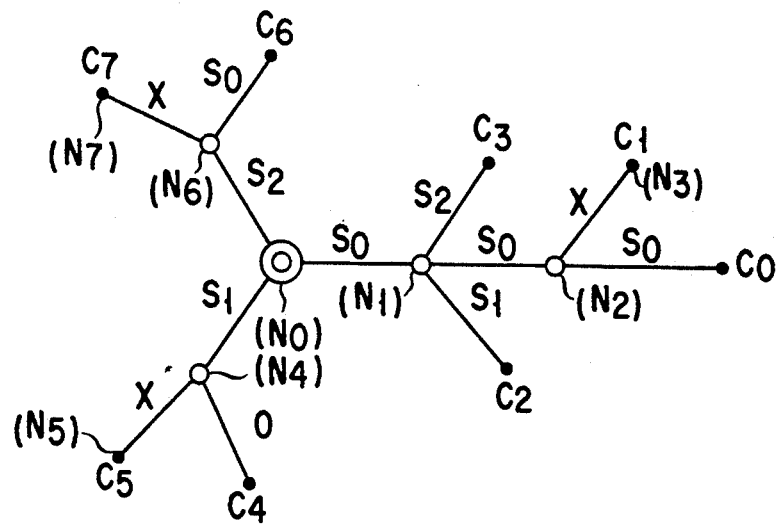
FIG. 8

| CODE WORD | CORRESPONDING INFORMATION SYMBOL STRING |
|-----------|------------------------------------------|
| $C_0$ | $S_0, S_0, S_0$ |
| $C_1$ | $S_0, S_0, X$ |
| $C_2$ | $S_0, S_1$ |
| $C_3$ | $S_0, S_2$ |
| $C_4$ | $S_1, S_0$ |
| $C_5$ | $S_1, X$ |
| $C_6$ | $S_2, S_0$ |
| $C_7$ | $S_2, X$ |
X IS $S_1$ OR $S_2$
FIG. 9
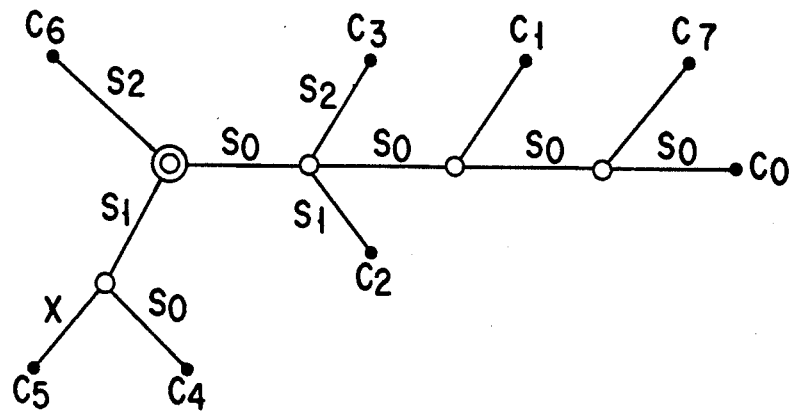
FIG. 10
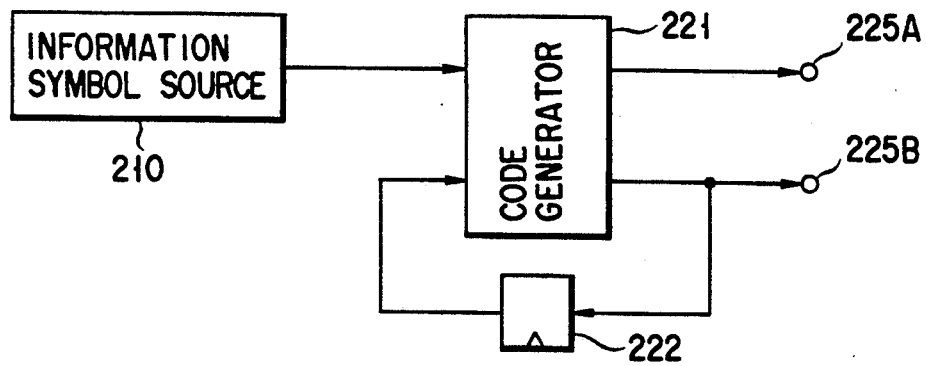
FIG. 14

| CODE | INFORMATION SYMBOL | GENERATION PROBABILITY |
|---|---|---|
| $C_0$ | $S_0$ $X_3$ | 0.005 |
| $C_1$ | $S_1$ $X_2$ | 0.06 |
| $C_2$ | $S_2$ $X_2$ | 0.038 |
| $C_3$ | $S_3$ | 0.01 |
| $C_4$ | $S_0$ $S_0$ $X_2$ | 0.05 |
| $C_5$ | $S_1$ $S_0$ $X_1$ | 0.075 |
| $C_6$ | $S_0$ $S_1$ $X_1$ | 0.075 |
| $C_7$ | $S_0$ $S_0$ $S_0$ $X_1$ | 0.0625 |
| $C_8$ | $S_2$ $S_0$ | 0.095 |
| $C_9$ | $S_1$ $S_1$ | 0.09 |
| $C_{10}$ | $S_1$ $S_0$ $S_0$ | 0.075 |
| $C_{11}$ | $S_0$ $S_1$ $S_0$ | 0.075 |
| $C_{12}$ | $S_0$ $S_0$ $S_1$ | 0.075 |
| $C_{13}$ | $S_0$ $S_0$ $S_0$ $S_0$ | 0.0625 |
| $C_{14}$ | $S_0$ $S_2$ | 0.095 |
| $C_{15}$ | $S_2$ $S_1$ | 0.057 |

$X_1$ = PROBABILITY OF ONE OF $\{S_1, S_2, S_3\}$ ----- 0.5
$X_2$ = PROBABILITY OF ONE OF $\{S_2, S_3\}$ ----- 0.2
$X_3$ = PROBABILITY OF $\{S_3\}$ ----- 0.01

FIG. 12

| CODE | INFORMATION SYMBOL | GENERATION PROBABILITY |
|---|---|---|
| $C_0$ | $S_0$ $X_3$ | 0.005 |
| $C_1$ | $S_1$ $X_2$ | 0.06 |
| $C_2$ | $S_2$ $X_1$ | 0.038 |
| $C_3$ | $S_3$ | 0.01 |
| $C_4$ | $S_0$ $S_0$ $X_2$ | 0.05 |
| $C_5$ | $S_1$ $S_0$ $X_1$ | 0.125 |
| $C_6$ | $S_0$ $S_1$ $X_1$ | 0.075 |
| $C_7$ | $S_0$ $S_0$ $S_0$ $X_1$ | 0.0625 |
| $C_8$ | $S_2$ $S_0$ | 0.095 |
| $C_9$ | $S_1$ $S_1$ | 0.09 |
| $C_{10}$ | $S_1$ $S_0$ $S_0$ | 0.075 |
| $C_{11}$ | $S_0$ $S_1$ $S_0$ | 0.075 |
| $C_{12}$ | $S_0$ $S_0$ $S_1$ | 0.075 |
| $C_{13}$ | $S_0$ $S_0$ $S_0$ $S_0$ | 0.0625 |
| $C_{14}$ | $S_0$ $S_2$ | 0.095 |
| $C_{15}$ | NOT ASSIGNED | 0.057 |

$X_1$ = PROBABILITY OF ONE OF $\{S_1, S_2, S_3\}$ ----- 0.5
$X_2$ = PROBABILITY OF ONE OF $\{S_2, S_3\}$ ----- 0.2
$X_3$ = PROBABILITY OF $\{S_3\}$ ----- 0.01

FIG. 13

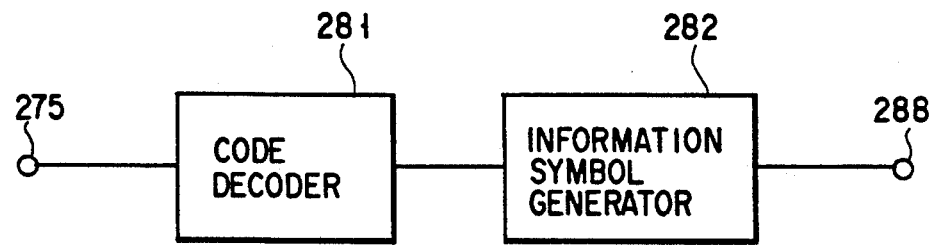
F I G. 15
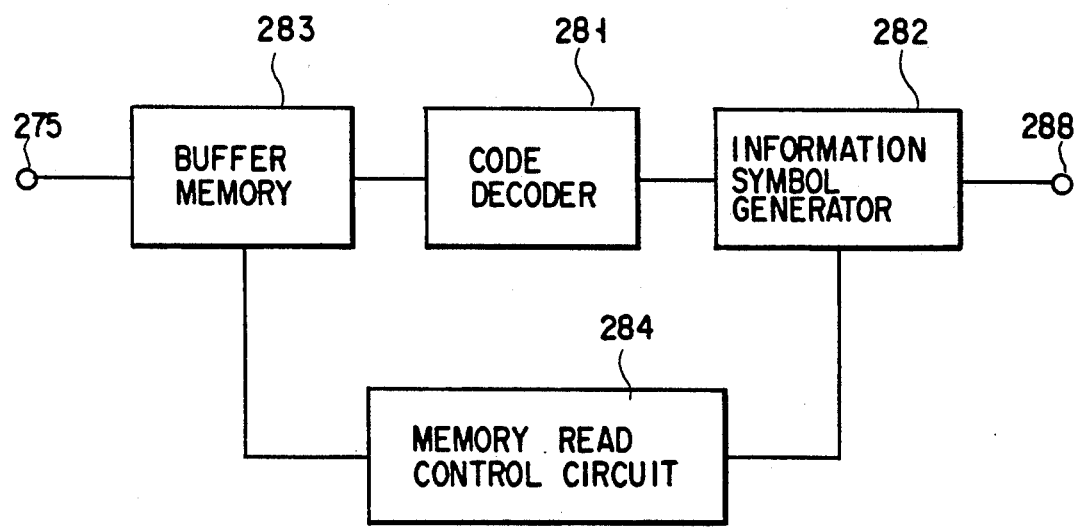
F I G. 16

F I G. 17A
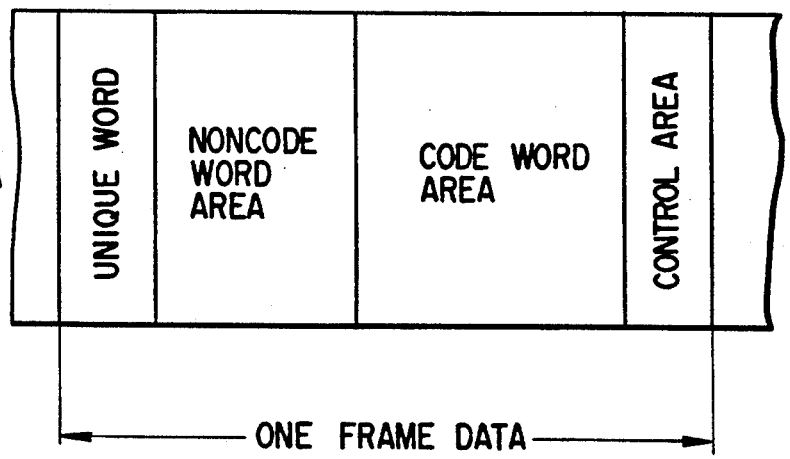
F I G. 17B
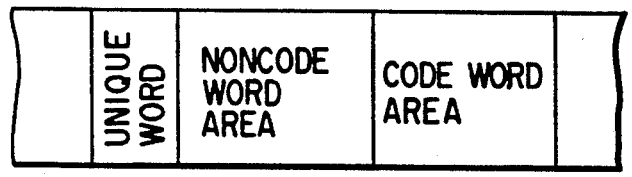
F I G. 17C
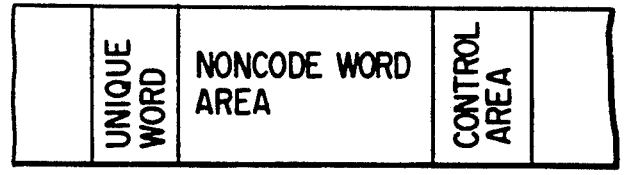
F I G. 17D

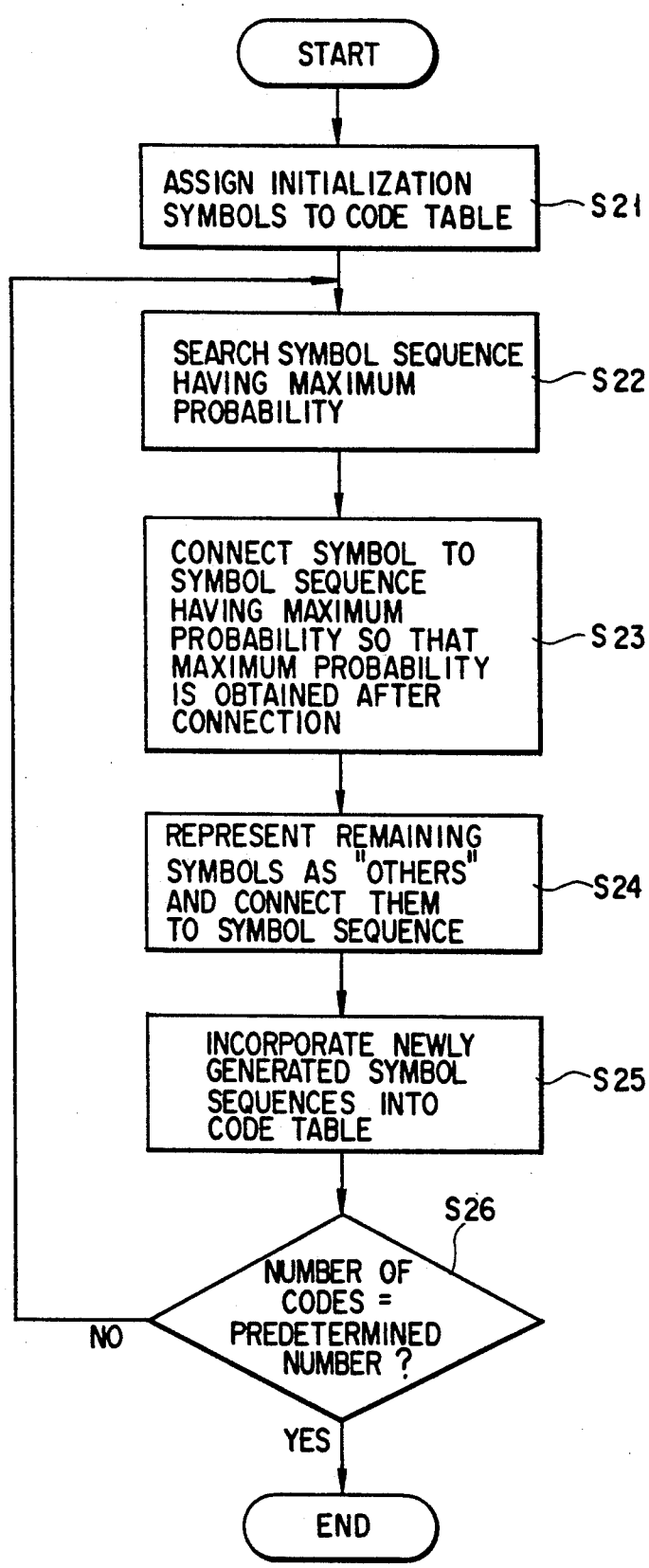
F I G. 20

$$S'(A) = S(A) \cdot \frac{P(4) \cdot P(A)}{P(4)+P(0)} \cdot \frac{P(1) \cdot P(A)}{P(1)} \cdot \frac{P(2) \cdot P(A)}{P(2)} \cdot \frac{P(3) \cdot P(A)}{P(3)}$$

$$S'(B) = S(B) \cdot \frac{P(4)+P(B)+P(0) \cdot \frac{P(B)}{P(B)+P(C)+P(D)}}{P(4)+P(0)} \cdot \frac{P(1) \cdot P(B)}{P(1)} \cdot \frac{P(2) \cdot P(B)}{P(2)} \cdot \frac{P(3) \cdot P(B)}{P(3)}$$

$$S'(C) = S(C) \cdot \frac{P(4)+P(C)+P(0) \cdot \frac{P(C)}{P(B)+P(C)+P(D)}}{P(4)+P(0)} \cdot \frac{P(1) \cdot P(C)}{P(1)} \cdot \frac{P(2) \cdot P(C)}{P(2)} \cdot \frac{P(3) \cdot P(C)}{P(3)}$$

$$S'(D) = S(D) \cdot \frac{P(4)+P(D)+P(0) \cdot \frac{P(D)}{P(B)+P(C)+P(D)}}{P(4)+P(0)} \cdot \frac{P(1) \cdot P(D)}{P(1)} \cdot \frac{P(2) \cdot P(D)}{P(2)} \cdot \frac{P(3) \cdot P(D)}{P(3)}$$

F I G. 22

$P'(0) = \overline{S}(A) \cdot \dfrac{P(0)}{P(0)+P(4)}$    $P(0) \sim P(4)$ : PROBABILITIES OF CODES 0 TO 4 (BEFORE CORRECTION)

$P'(1) = \overline{S}(B) \cdot \dfrac{P(1)}{P(1)}$    $P'(0) \sim P'(4)$ : PROBABILITIES OF CODES 0 TO 4 (AFTER CORRECTION)

$P'(2) = \overline{S}(C) \cdot \dfrac{P(2)}{P(2)}$    $S(A) \sim S(D)$ : PROBABILITIES OF CODES BEGINNING WITH SYMBOLS A TO D (BEFORE TRANSITION)

$P'(3) = \overline{S}(D) \cdot \dfrac{P(3)}{P(3)}$    $S'(A) \sim S'(D)$ : PROBABILITIES OF CODES BEGINNING WITH SYMBOLS A TO D (AFTER TRANSITION)

$P'(4) = \overline{S}(A) \cdot \dfrac{P(0)}{P(0)+P(4)}$    $\overline{S}(A) \sim \overline{S}(D)$ : PROBABILITIES OF CODES BEGINNING WITH SYMBOLS A TO D (STATIONARY STATE)

$P(A) \sim P(D)$ : GENERATION PROBABILITIES OF SYMBOLS A TO D

FIG. 23

| CODE | SYMBOL SEQUENCE |
|---|---|
| 0 | A x |
| 1 | B x |
| 2 | C x |
| 3 | D |
| 4 | A A |
| 5 | A B |
| 6 | B A |
| 7 | C A |

| CURRENT STATE 330 | NEXT STATE 322 | | | | OUTPUT 312 | | | |
|---|---|---|---|---|---|---|---|---|
| | A | B | C | D | A | B | C | D |
| 0 (A) | 4 | 4 | 2 | 3 | 4 | 5 | 0 | 0 |
| 1 (B) | 4 | 1 | 2 | 3 | 6 | 1 | 1 | 1 |
| 2 (C) | 4 | 1 | 2 | 3 | 7 | 2 | 2 | 2 |
| 3 (D) | 0 | 1 | 2 | 3 | 3 | 3 | 3 | 3 |
| 4 (INITIAL STATE) | 0 | 1 | 2 | 3 | — | — | — | — |

| INPUT 302 | STATE 332 | STATE TABLE 320 | OUTPUT TABLE 310 |
|---|---|---|---|
| B | 4 | 1 | — |
| C | 1 | 2 | 1 |
| A | 2 | 4 | 7 |
| D | 4 | 3 | — |
| A | 3 | 0 | 3 |
| ⋮ | ⋮ | ⋮ | ⋮ |
F I G. 26
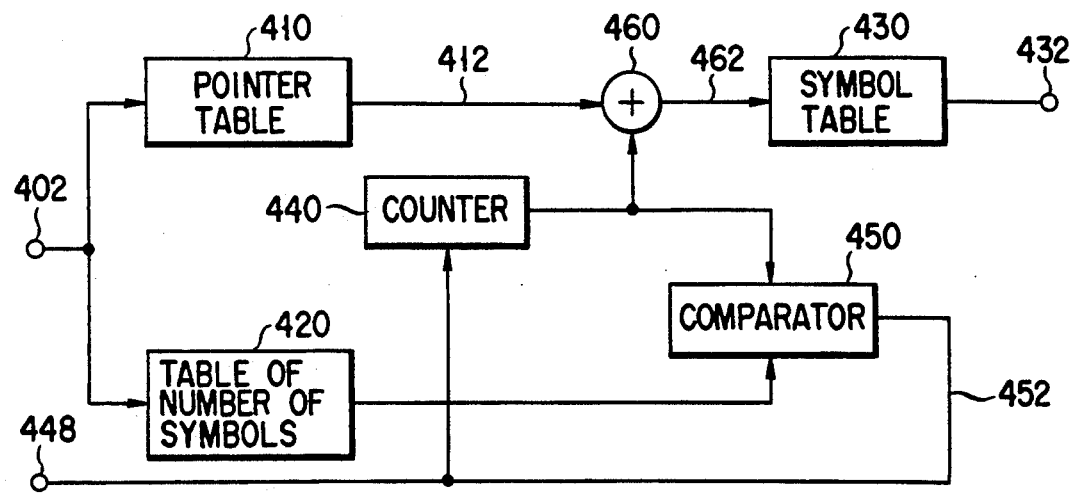
F I G. 27

| CODE | POINTER TABLE 410 | TABLE 420 OF NUMBER OF SYMBOLS |
|---|---|---|
| 0 | 0 | 1 |
| 1 | 1 | 1 |
| 2 | 2 | 1 |
| 3 | 3 | 1 |
| 4 | 4 | 2 |
| 5 | 6 | 2 |
| 6 | 8 | 2 |
| 7 | 10 | 2 |

FIG. 28A

| SUM OUTPUT 462 | SYMBOL TABLE 430 |
|---|---|
| 0 | A |
| 1 | B |
| 2 | C |
| 3 | D |
| 4 | A |
| 5 | A |
| 6 | A |
| 7 | B |
| 8 | B |
| 9 | A |
| 10 | C |
| 11 | A |

FIG. 28B

| CODE OF INPUT 402 | POINTER TABLE 410 | TABLE 420 OF NUMBER OF SYMBOLS | COUNTER 440 | SUM OUTPUT 462 | OUTPUT 432 | COINCIDENCE SIGNAL 452 |
|---|---|---|---|---|---|---|
| 1 | 1 | 1 | 0→1 | 1 | B | YES |
| 7 | 10 | 2 | 0→1 | 10 | C | NO |
| " | " | " | 1→2 | 11 | A | YES |
| 3 | 3 | 1 | 0→1 | 3 | D | YES |
| . | . | . | . | . | . | . |
| . | . | . | . | . | . | . |
| . | . | . | . | . | . | . |

FIG. 29

| CODE | SYMBOL SE-QUENCE | PROBABILITY |
|---|---|---|
| 0 | Ax | $P(A) \times \{P(C|A)+P(D|A)\}$ |
| 1 | Bx | $P(A) \times \{P(B|B)+P(C|B)+P(D|B)\}$ |
| 2 | Cx | $P(C) \times \{P(B|C)+P(C|C)+P(D|C)\}$ |
| 3 | Dx | $P(D)$ |
| 4 | AA | $P(A) \times P(A|A)$ |
| 5 | AB | $P(A) \times P(B|A)$ |
| 6 | BA | $P(B) \times P(A|B)$ |
| 7 | CA | $P(C) \times P(A|C)$ |

FIG. 30

| CODE | TABLE 1 | TABLE 2 | TABLE 3 |
|---|---|---|---|
| 0 | Ax | Bx | CA |
| 1 | Bx | Cx | CB |
| 2 | Cx | Dx | CC |
| 3 | Dx | BA | CD |
| 4 | AA | BB | DA |
| 5 | AB | CA | DB |
| 6 | BA | CB | DC |
| 7 | CA | DA | DD |

FIG. 31

| INPUT 302 | STATE 332 | STATE 308 | OUTPUT 312 | TABLE NUMBER 352 |
|---|---|---|---|---|
| 1 | 4 | 1 | — | 1 |
| 2 | 1 | 1 | 1 | 1→2 |
| 0 | 1 | 4 | 5 | 2→1 |
| 3 | 4 | 3 | — | 1 |
| 0 | 3 | 0 | 3 | 1→1 |

TABLE 1

| CURRENT STATE 332 | STATE TABLE 320 | | | | OUTPUT TABLE 310 | | | | NEXT TABLE 340 | | | |
|---|---|---|---|---|---|---|---|---|---|---|---|---|
| | A | B | C | D | A | B | C | D | A | B | C | D |
| 0 | 4 | 4 | 0 | 1 | 4 | 5 | 0 | 0 | 1 | 1 | 3 | 3 |
| 1 | 4 | 0 | 1 | 2 | 6 | 1 | 1 | 1 | 1 | 2 | 2 | 2 |
| 2 | 4 | 0 | 1 | 2 | 7 | 2 | 2 | 2 | 1 | 2 | 2 | 2 |
| 3 | 0 | 1 | 2 | 3 | 3 | 3 | 3 | 3 | 1 | 1 | 1 | 1 |
| 4 | 0 | 1 | 2 | 3 | — | — | — | — | — | — | — | — |

FIG. 33A

TABLE 2

| CURRENT STATE 332 | STATE TABLE 320 | | | | OUTPUT TABLE 310 | | | | NEXT TABLE 340 | | | |
|---|---|---|---|---|---|---|---|---|---|---|---|---|
| | A | B | C | D | A | B | C | D | A | B | C | D |
| 0 | 4 | 4 | 0 | 1 | 3 | 4 | 0 | 0 | 1 | 1 | 3 | 3 |
| 1 | 4 | 4 | 0 | 1 | 5 | 6 | 1 | 1 | 1 | 1 | 3 | 3 |
| 2 | 4 | 0 | 1 | 2 | 7 | 2 | 2 | 2 | 1 | 2 | 2 | 2 |

FIG. 33B

TABLE 3

| CURRENT STATE 332 | STATE TABLE 320 | | | | OUTPUT TABLE 310 | | | | NEXT TABLE 340 | | | |
|---|---|---|---|---|---|---|---|---|---|---|---|---|
| | A | B | C | D | A | B | C | D | A | B | C | D |
| 0 | 4 | 4 | 4 | 4 | 0 | 1 | 2 | 3 | 1 | 1 | 1 | 1 |
| 1 | 4 | 4 | 4 | 4 | 4 | 5 | 6 | 7 | 1 | 1 | 1 | 1 |

FIG. 33C

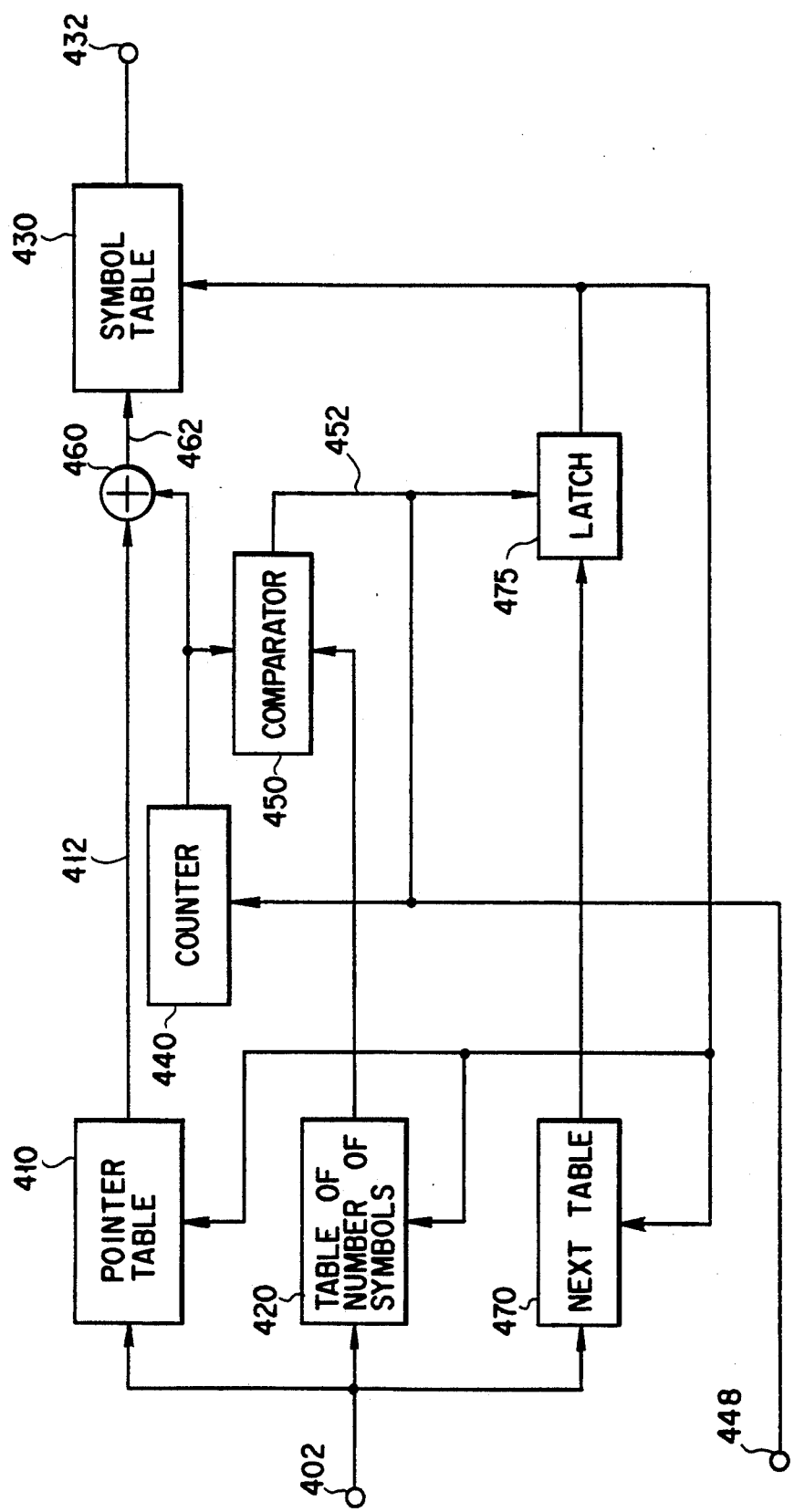
F I G. 35

TABLE 1

| CODE | POINTER TABLE 410 | TABLE 420 OF NUMBER OF SYMBOLS | NEXT TABLE 470 |
|---|---|---|---|
| 0 | 0 | 1 | 3 |
| 1 | 1 | 1 | 2 |
| 2 | 2 | 1 | 2 |
| 3 | 3 | 1 | 1 |
| 4 | 5 | 2 | 1 |
| 5 | 7 | 2 | 1 |
| 6 | 9 | 2 | 1 |
| 7 | 11 | 2 | 1 |

FIG. 36A

| SUM OUTPUT 462 | SYMBOL TABLE 430 |
|---|---|
| 0 | A |
| 1 | B |
| 2 | C |
| 3 | D |
| 4 | A |
| 5 | A |
| 6 | A |
| 7 | B |
| 8 | B |
| 9 | A |
| 10 | C |
| 11 | A |

FIG. 36B

TABLE 2

| CODE | POINTER TABLE 410 | TABLE 420 OF NUMBER OF SYMBOLS | NEXT TABLE 470 |
|---|---|---|---|
| 0 | 0 | 1 | 3 |
| 1 | 1 | 1 | 3 |
| 2 | 2 | 1 | 2 |
| 3 | 3 | 2 | 1 |
| 4 | 4 | 2 | 1 |
| 5 | 7 | 2 | 1 |
| 6 | 9 | 2 | 1 |
| 7 | 11 | 2 | 1 |

FIG. 37A

| SUM OUTPUT 462 | SYMBOL TABLE 430 |
|---|---|
| 0 | B |
| 1 | C |
| 2 | D |
| 3 | B |
| 4 | A |
| 5 | B |
| 6 | B |
| 7 | C |
| 8 | A |
| 9 | C |
| 10 | B |
| 11 | D |
| 12 | A |

FIG. 37B

TABLE 3

| CODE | POINTER TABLE 410 | TABLE 420 OF NUMBER OF SYMBOLS | NEXT TABLE 470 |
|---|---|---|---|
| 0 | 0 | 2 | 1 |
| 1 | 2 | 2 | 1 |
| 2 | 4 | 2 | 1 |
| 3 | 6 | 2 | 1 |
| 4 | 8 | 2 | 1 |
| 5 | 10 | 2 | 1 |
| 6 | 12 | 2 | 1 |
| 7 | 14 | 2 | 1 |

FIG. 38A

| SUM OUTPUT 462 | SYMBOL TABLE 430 |
|---|---|
| 0 | C |
| 1 | A |
| 2 | C |
| 3 | B |
| 4 | C |
| 5 | C |
| 6 | C |
| 7 | D |
| 8 | D |
| 9 | A |
| 10 | D |
| 11 | B |
| 12 | D |
| 13 | C |
| 14 | D |
| 15 | D |

FIG. 38B

| CODE OF INPUT 402 | POINTER TABLE 410 | TABLE 420 OF NUMBER OF SYMBOLS | COUNTER 440 | SUM OUTPUT 462 | SYMBOL TABLE 430 | NEXT TABLE 470 | NEXT CODE 452 |
|---|---|---|---|---|---|---|---|
| 1 | 1 | 1 | 0→1 | 0 | B | 2 | YES |
| 5 | 7 | 2 | 0→1 | 7 | C | 1 | NO |
| " | " | " | 1→2 | 8 | A | " | YES |
| 3 | 3 | 1 | 0→1 | 3 | D | 1 | YES |
| . | . | . | . | . | . | . | . |
| . | . | . | . | . | . | . | . |
| . | . | . | . | . | . | . | . |

F I G. 39

| CODE | SYMBOL SEQUENCE | IMMEDIATELY PRECEDING CODE | | | |
|---|---|---|---|---|---|
| | | "OTHERS" NONE | "OTHERS" (B,C,D) | "OTHERS" (C,D) | "OTHERS" (D) |
| 0 | Ax | ○ | | × | × |
| 1 | Bx | ○ | × | × | × |
| 2 | Cx | ○ | ○ | ○ | × |
| 3 | D | ○ | ○ | ○ | ○ |
| 4 | AA | ○ | × | × | × |
| 5 | AB | ○ | × | × | × |
| 6 | BA | ○ | ○ | × | × |
| 7 | CA | ○ | ○ | ○ | × |
| NUMBER OF EFFECTIVE CODES | | 8 | 5 | 3 | 1 |

F I G. 40

| CODE | IMMEDIATELY PRECEDING CODE | | | | | | | |
|---|---|---|---|---|---|---|---|---|
| | "OTHERS" NONE | | "OTHERS" (B,C,D) | | "OTHERS" (C,D) | | "OTHERS" (D) | |
| | "OTHERS" | | "OTHERS" | | "OTHERS" | | "OTHERS" | |
| 0 | Ax | ○ | Bx | ○ | Cx | ○ | Dx | ○ |
| 1 | Bx | ○ | Cx | ○ | Dx | ○ | — | × |
| 2 | Cx | ○ | Dx | ○ | — | × | — | × |
| 3 | D | ○ | — | × | — | × | — | × |
| 4 | AA | ○ | BA | ○ | CA | ○ | DA | ○ |
| 5 | AB | ○ | BB | ○ | CB | ○ | DB | ○ |
| 6 | BA | ○ | CA | ○ | DA | ○ | — | × |
| 7 | CA | ○ | DA | ○ | — | × | — | × |
| NUMBER OF EFFECTIVE CODES | | 8 | | 7 | | 5 | | 3 |

FIG. 41

| CURRENT STATE | NEXT STATE | | | | OUTPUT | | | |
|---|---|---|---|---|---|---|---|---|
| | 0 | 1 | 2 | 3 | 0 | 1 | 2 | 3 |
| 0 (0) | 4 | 4 | 0 | 1 | 4 | 5 | 0 | 0 |
| 1 (1) | 4 | 0 | 1 | 2 | 6 | 1 | 1 | 1 |
| 2 (2) | 4 | 0 | 1 | 2 | 7 | 2 | 2 | 2 |
| 3 (3) | 0 | 1 | 2 | 3 | 3 | 3 | 3 | 3 |
| 4 (INITIAL STATE) | 0 | 1 | 2 | 3 | — | — | — | — |

FIG. 42

| INPUT 302 | STATE 332 | STATE TABLE 320 | OUTPUT TABLE 310 |
|---|---|---|---|
| 1 | 4 | 1 | — |
| 2 | 1 | 1 | 1 |
| 0 | 1 | 4 | 6 |
| 3 | 4 | 3 | — |
| 0 | 3 | 0 | 3 |
| ⋮ | ⋮ | ⋮ | ⋮ |

FIG. 43

| CODE | POINTER TABLE 410 | TABLE 420 OF NUMBER OF SYMBOLS | LEADING SYMBOL MOVING AMOUNT TABLE 480 |
|---|---|---|---|
| 0 | 0 | 1 | 2 |
| 1 | 1 | 1 | 1 |
| 2 | 2 | 1 | 1 |
| 3 | 3 | 1 | 0 |
| 4 | 4 | 2 | 0 |
| 5 | 6 | 2 | 0 |
| 6 | 8 | 2 | 0 |
| 7 | 10 | 2 | 0 |

FIG. 45A

| SUM OUTPUT 462 | SYMBOL TABLE 430 |
|---|---|
| 0 | 0 |
| 1 | 1 |
| 2 | 2 |
| 3 | 3 |
| 4 | 0 |
| 5 | 0 |
| 6 | 0 |
| 7 | 1 |
| 8 | 1 |
| 9 | 0 |
| 10 | 2 |
| 11 | 0 |

FIG. 45B

| CODE OF INPUT 402 | POINTER TABLE 410 | TABLE 420 OF NUMBER OF SYMBOLS | COUNTER 440 | SUM OUTPUT 462 | SYMBOL TABLE 430 | LEADING SYMBOL MOVING AMOUNT TABLE 480 | OUTPUT 492 | COINCIDENCE SIGNAL 452 |
|---|---|---|---|---|---|---|---|---|
| 1 | 1 | 1 | 0→1 | 1 | 1 | 0 | 1 | YES |
| 6 | 8 | 2 | 0→1 | 8 | 1 | 1 | 2 | NO |
| ‥ | ‥ | ‥ | 1→2 | 9 | 0 | ‥ | 0 | YES |
| 3 | 3 | 1 | 0→1 | 3 | 3 | 0 | 3 | YES |
| ‥ | ‥ | ‥ | ‥ | ‥ | ‥ | ‥ | ‥ | ‥ |

FIG. 46

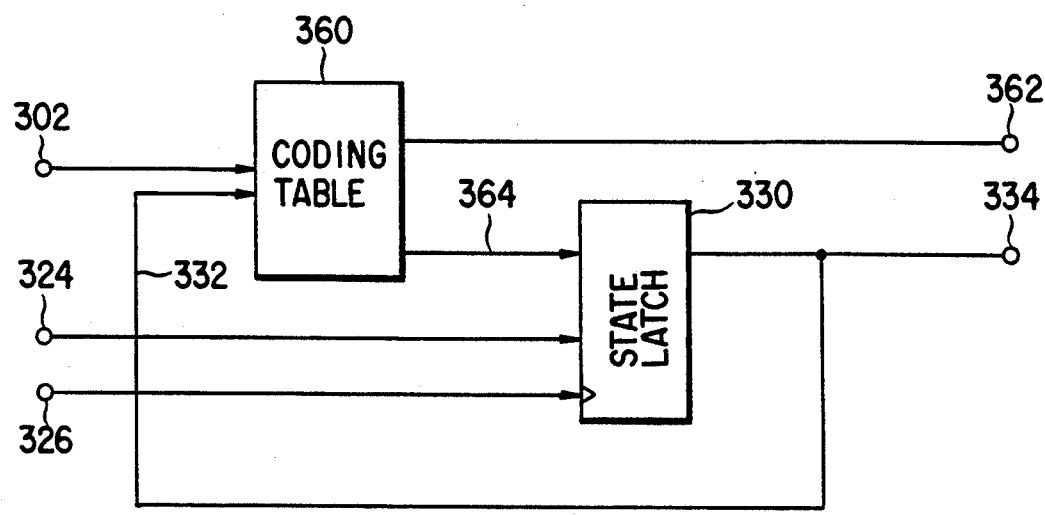
F I G. 49
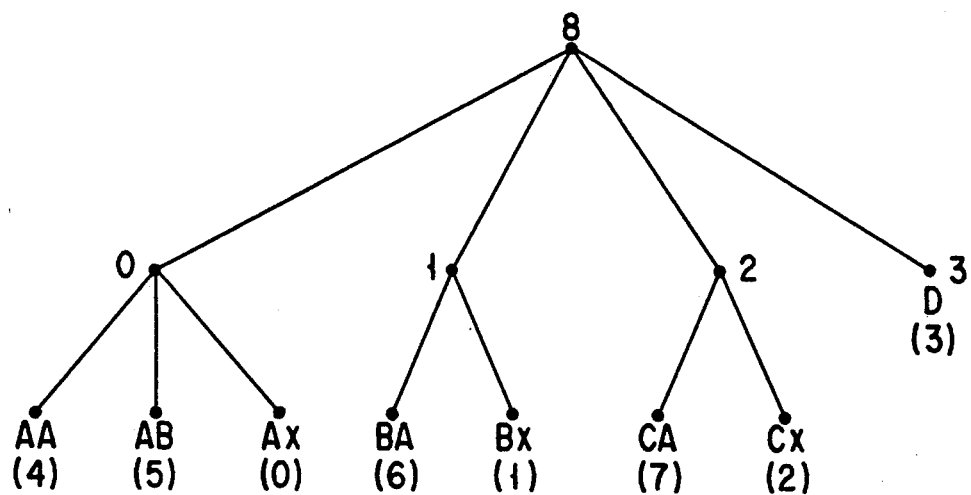
F I G. 50

| STATE 332 | CODE (STATE) 364 | | | | OUTPUT ENABLE 362 | | | |
|---|---|---|---|---|---|---|---|---|
| | A | B | C | D | A | B | C | D |
| 0 | 4 | 5 | 2 | 3 | 1 | 1 | 0 | 0 |
| 1 | 6 | 1 | 2 | 3 | 1 | 0 | 0 | 0 |
| 2 | 7 | 1 | 2 | 3 | 1 | 0 | 0 | 0 |
| 3 | 0 | 1 | 2 | 3 | 0 | 0 | 0 | 0 |
| 4 | 0 | 1 | 2 | 3 | 0 | 0 | 0 | 0 |
| 5 | 0 | 1 | 2 | 3 | 0 | 0 | 0 | 0 |
| 6 | 0 | 1 | 2 | 3 | 0 | 0 | 0 | 0 |
| 7 | 0 | 1 | 2 | 3 | 0 | 0 | 0 | 0 |
| 8 | 0 | 1 | 2 | 3 | 1 | 1 | 1 | 1 |

FIG. 51

| INPUT 302 | STATE 332 | CODE (STATE) 364 | OUTPUT ENABLE 362 |
|---|---|---|---|
| B | 8 | 1 | 1 |
| A | 1 | 6 | 1 |
| C | 6 | 2 | 0 |
| A | 2 | 7 | 1 |
| D | 7 | 3 | 0 |
| ... | ... | ... | 0 |

FIG. 52

| STATE 332 | FORCED OUTPUT 306 = "0" (FORCED OUTPUT OFF) ||||||||| FORCED OUTPUT 306 = "1" (FORCED OUTPUT ON) |||||||| |
| | CODE (STATE) 364 |||| OUTPUT ENABLE 362 |||| CODE (STATE) 364 |||| OUTPUT ENABLE 362 ||||
| | A | B | C | D | A | B | C | D | A | B | C | D | A | B | C | D |
| 0 | 4 | 5 | 6 | 7 | 1 | 1 | 1 | 1 | 0 | 1 | 2 | 3 | 0 | 0 | 0 | 0 |
| 1 | 0 | 1 | 2 | 3 | 0 | 0 | 0 | 0 | 0 | 1 | 2 | 3 | 0 | 0 | 0 | 0 |
| 2 | 0 | 1 | 2 | 3 | 0 | 0 | 0 | 0 | 0 | 1 | 2 | 3 | 0 | 0 | 0 | 0 |
| 3 | 0 | 1 | 2 | 3 | 0 | 0 | 0 | 0 | 0 | 1 | 2 | 3 | 0 | 0 | 0 | 0 |
| 4 | 0 | 1 | 2 | 3 | 0 | 0 | 0 | 0 | 0 | 1 | 2 | 3 | 0 | 0 | 0 | 0 |
| 5 | 0 | 1 | 2 | 3 | 0 | 0 | 0 | 0 | 0 | 1 | 2 | 3 | 0 | 0 | 0 | 0 |
| 6 | 0 | 1 | 2 | 3 | 0 | 0 | 0 | 0 | 0 | 1 | 2 | 3 | 0 | 0 | 0 | 0 |
| 7 | 0 | 1 | 2 | 3 | 0 | 0 | 0 | 0 | 0 | 1 | 2 | 3 | 0 | 0 | 0 | 0 |
| 8 | 0 | 1 | 2 | 3 | 1 | 1 | 1 | 1 | 8 | 8 | 8 | 8 | 1 | 1 | 1 | 1 |

FIG. 55

| INPUT 302 | FORCED OUTPUT 306 | STATE 332 | CODE (STATE) 364 | OUTPUT ENABLE 362 |
|---|---|---|---|---|
| B | 0 | 8 | 1 | 1 |
| A | 0 | 1 | 0 | 0 |
| C | 0 | 0 | 6 | 1 |
| A | 0 | 6 | 0 | 0 |
| D | 1 | 0 | 3 | 0 |
| ... | ... | ... | ... | 0 |

| CODE | SYMBOL SEQUENCE | | |
|------|---|---|---|
| D0 | 0 | x | x |
| D1 | 1 | x | x |
| D2 | 2 | | |
| D3 | 3 | | |
| D4 | 4 | | |
| D5 | 0 | 0 | |
| D6 | 0 | 1 | |
| D7 | 1 | 0 | |

F I G. 60

| CODE | SYMBOL SEQUENCE | | |
|------|---|---|---|
| C0 | 0 | x | x |
| C1 | 1 | x | x |
| C2 | 2 | | |
| C3 | 0 | 0 | x |
| C4 | 0 | 1 | 0 |
| C5 | 1 | 0 | |
| C6 | 1 | 1 | 0 |
| C7 | 0 | 0 | 0 |

F I G. 59

| SYMBOL | REMAINDER SYSTEM |
|--------|------------------|
| 0 | (0, 0) |
| 1 | (1, 1) |
| 2 | (2, 2) |
| 3 | (0, 3) |
| 4 | (1, 4) |
| 5 | (2, 0) |
| 6 | (0, 1) |
| 7 | (1, 2) |
| 8 | (2, 3) |
| 9 | (0, 4) |
| 10 | (1, 0) |
| 11 | (2, 1) |
| 12 | (0, 2) |
| 13 | (1, 3) |
| 14 | (2, 4) |

F I G. 58

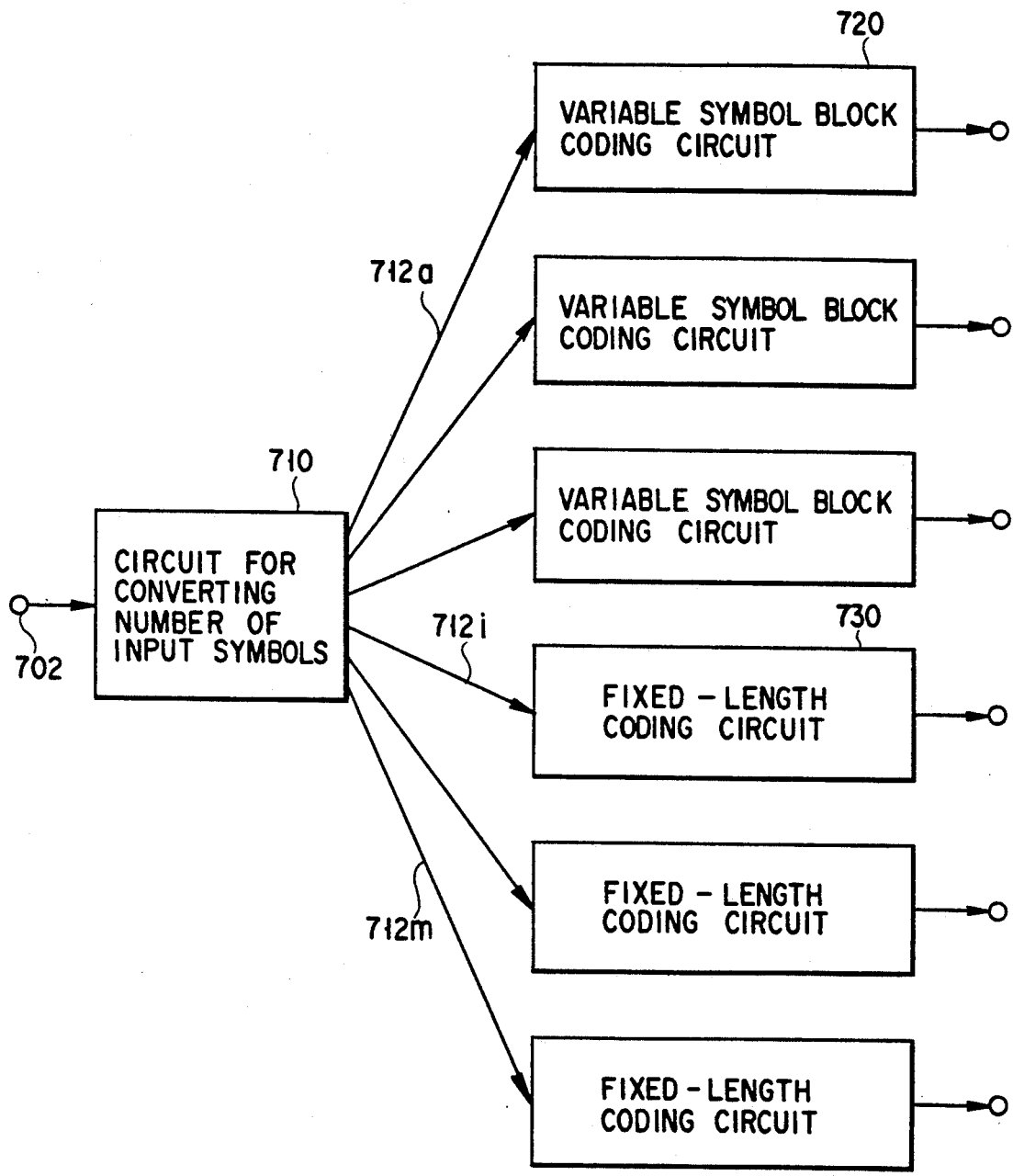
F I G. 61

FIG. 62

| SYMBOL | (QUOTIENT, REMAINDER) |
|---|---|
| 0 | (0, 0) |
| 1 | (0, 1) |
| 2 | (0, 2) |
| 3 | (0, 3) |
| 4 | (1, 0) |
| 5 | (1, 1) |
| 6 | (1, 2) |
| 7 | (1, 3) |
| 8 | (2, 0) |
| 9 | (2, 1) |
| 10 | (2, 2) |
| 11 | (2, 3) |
| 12 | (3, 0) |
| 13 | (3, 1) |
| 14 | (3, 2) |

FIG. 63

| CODE | SYMBOL SEQUENCE |
|---|---|
| E0 | 0 X |
| E1 | 1 X |
| E2 | 2 |
| E3 | 3 |
| E4 | 0 0 X |
| E5 | 1 0 |
| E6 | 2 0 |
| E7 | 0 0 0 |

FIG. 64

| FIXED-LENGTH CODE | SYMBOL |
|---|---|
| F0 (0 0) | 0 |
| F1 (0 1) | 1 |
| F2 (1 0) | 2 |
| F3 (1 1) | 3 |

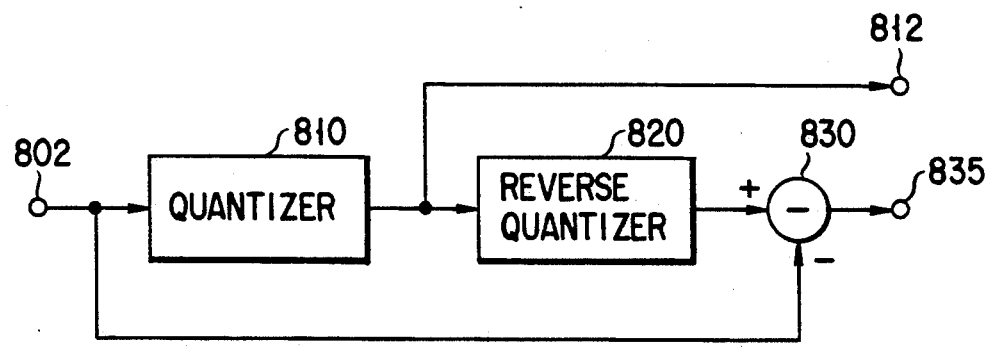
F I G. 65

CODING APPARATUS AND METHOD FOR CODING INFORMATION SYMBOL STRINGS BY ASSIGNING FIXED LENGTH CODES THERETO

BACKGROUND OF THE INVENTION

1. Field of the Invention

The present invention relates to a coding apparatus and a coding method of coding symbol sequences consisting of a variable number of symbols by assigning fixed-length codes to the symbol sequences.

2. Description of the Related Art

Variable-length coding represented by Huffman coding is available as one of techniques of coding information, such as image information or voice information, at a high efficiency. The variable-length coding can express a given amount of information of an information source, such as image information or voice information, at a high efficiency compared with fixed-length coding. In recent years, therefore, the variable-length coding is widely used in compressing and transmitting or recording information. This variable-length coding is a technique of making the length of a code word variable on the basis of generation probabilities of symbols of an information source.

The fixed-length coding, on the other hand, generates a code word with a fixed length regardless of the generation probabilities of symbols of an information source. The fixed-length coding alone cannot code information at a high efficiency. Therefore, nonlinear quantization, for example, is used to make the generation probabilities of symbols of respective information sources almost constant, and then fixed-length code words are produced, thereby achieving a high efficiency.

That is, the fixed-length coding is generally required to be used in combination with the nonlinear quantization in order to achieve a high efficiency. The variable-length coding, on the other hand, need not be combined with the nonlinear quantization. In addition, the variable-length coding is superior to the fixed-length coding in terms of the degree of freedom of selection for a quantizer and quantization distortion. For these reasons, the variable-length coding has been widely used recently.

As compared with the fixed-length coding, however, the variable-length coding is easily affected by errors and requires a complicated arrangement. These drawbacks of the variable-length coding will be explained below.

Code words obtained by the variable-length coding are generally transmitted or recorded serially. Therefore, in order to decode variable-length-coded code words, after the start of the first code word is found by some means, decoding of that code word is started The start of the next code word is found when decoding of the first code word is finished. Therefore, word synchronization (i.e., finding the start of a code word) of variable-length-coded code words is established by decoding of the immediately preceding code word. If an error occurs in the immediately preceding code word in question by a transmission failure, a code word cannot be correctly decoded by the variable-length coding. As a result, in the variable-length coding, there is a high probability that a code word is decoded into a code word with a code length different from that of the original code word. In addition, the word synchronization is disturbed at a high possibility. Once the word synchronization is disturbed in the variable-length coding, the results of decoding obtained before the word synchronization is established again by some means are all errors. Note that the word synchronization is sometimes established while decoding is repeated in a condition which is erroneous in terms of probability.

If an error occurs due to a transmission failure during decoding of variable-length-coded code words as described above, the error propagates because the word synchronization is disturbed. That is, in decoding variable-length-coded code words, it is essential to perform establishment of the word synchronization and decoding of the code words at the same time. In the fixed-length coding, on the other hand, since the word synchronization and decoding of code words are independent from each other, no propagation of errors occurs unlike in the variable-length coding. Therefore, it is essential that decoding of variable-length-coded code words is performed while the word synchronization is established.

In order to transmit information, a format (syntax) for transmitting the information is required regardless of whether the fixed-length coding or the variable-length coding is used. This format is constituted by a code word and noncode words, such as a sync word indicating the start of the code word and a parameter associated with coding. In particular, the sync word is called a unique word because it requires a pattern different from that of a variable-length code word. Variable-length code words are assigned with codes from the one having a shorter code length in accordance with the generation probabilities of information symbols. The unique word normally requires a pattern longer than the maximum word length of the code, and this degrades the information transmission efficiency.

Circuits for decoding serially transmitted or recorded code words in the variable-length coding are much more complicated than those for the fixed-length coding. In principle, variable-length codes are serially decoded bit by bit. However, the upper limit of an operation frequency processable in this method is not so high. In order to ensure the operation of a circuit even when maximum code lengths are successively received, the operation speed is almost the product of a mean symbol rate and the maximum code length.

A read operation of a buffer memory is also closely related to the limitation on the operation speed. That is, in order to serially perform decoding bit by bit, whether a given bit is to be read out is determined after decoding the immediately preceding bit. Therefore, since a feedback loop is included in the arrangement for reading out a buffer memory, the upper limit is again imposed on the operation speed. The principle of serially performing decoding bit by bit can be realized in video conferences or video telephones in which coding is performed at a comparatively low bit rate. In high-quality image transmission, however, since coding is performed at a high bit rate, it is difficult to realize circuits for decoding variable-length-coded code words.

Especially when the variable-length coding is applied to a recording/reproduction apparatus such as a digital VTR, since a perfect bit stream as obtained in normal reproduction cannot be obtained in special reproduction, it is very difficult to decode variable-length-coded code words When a method of inserting a guard bit string to enable decoding is adopted in order to avoid this inconvenience, another drawback of a low coding efficiency is introduced.

As described above, when the variable-length coding is used to code and transmit or record information signals, decoding of variable-length-coded code words must be performed essentially at the same time the word synchyronization is established. For this reason, the variable-length coding is easily affected by bit errors, and this makes it difficult to realize a decoding circuit. In the fixed-length coding, on the other hand, establishment of the word synchronization and decoding of code words can be performed independently of each other. Therefore, the fixed-length coding is not easily affected by bit errors. However, the fixed-length coding has a problem that it cannot express a given amount of information of an information source, such as image information or voice information, at a high efficiency as compared with the variable-length coding.

There is another conventional coding method which is different from the variable-length coding and in which fixed-length codes are assigned to a symbol sequence consisting of a variable number of symbols (e.g., F. Jelinek and K. S. Schneider, "On Variable-Length-to-Block Coding", IEEE Trans. Inform Theory. vol. IT-18, pp. 765–774, November 1972). FIG. 1 shows a flow chart of a method of determining a set of symbol sequences which can be assigned with codes by using this conventional technique, and FIG. 2 shows actual assignment as a tree structure.

Initially, codes "0" to "3" in a code table are assigned to symbols A to D (A→"0", B→"1", C→"2", D→"3"; step S11). A symbol sequence A corresponding to the code "0" indicating a maximum probability is searched (step S12). The individual symbols A, B, C, and D are respectively connected to the symbol sequence A searched in step S12, and new codes are assigned to the obtained new symbol sequences AA, AB, AC, and AD (step S13). A similar connecting operation is performed for all symbols, and codes are respectively assigned to them (step S14). The first code assignment (division) is thus finished. In this case, "1", "2", "3", "0", "4", "5", and "6" are assigned to B, C, D, AA, AB, AC, and AD, respectively In the second and subsequent code assignments, the operation is similarly performed. That is, a code indicating a maximum probability is obtained, and the individual symbols are connected to a symbol sequence corresponding to that code. This operation is performed for all symbols, and codes are assigned to them (steps S12 to S14). When a predetermined number of codes is reached, the code assignment to the symbol sequences is finished (step S15).

In the above conventional coding method, if generation probabilities of symbols locally distributed as in the example shown in FIG. 2, a code having a very small probability may be generated (e.g., a code "9", a symbol sequence AAD, a probability of 0.003481). Since a code with a low probability, such as this symbol sequence AAD, is almost never used in coding of symbol sequences, the overall coding efficiency is lowered. In this method since (the number of symbols−1) codes are added by each branching operation, a predetermined number of codes is not always reached. Therefore, a code which may never be used in coding may be generated.

FIG. 3 shows the arrangement of a conventional coding apparatus for executing the above coding method in which fixed-length codes are assigned to symbol sequences each consisting of a variable number of symbols. In the coding apparatus shown in FIG. 3, a symbol supplied from an input terminal 105 and an immediately preceding state 135 are supplied to an output table 110 and a state table 120, and an output from the state table 120 is held by a state latch 130. When the apparatus has an output, a code is supplied from the output table 110 to an output terminal 112, and an output enable signal is supplied from the output table 110 to an output terminal 114. Therefore, this conventional coding apparatus must have the output table 110 and the state table 120 independently of each other. The state latch 130 is initialized by a reset signal 122 and latches the output from the state table 120 in accordance with a clock 124.

FIG. 4 shows codes designed by using the conventional code designing method with seven codes In FIG. 4, symbols A, B, C, and D connectable to the symbol A are all connected to the symbol A, and codes are assigned to symbol sequences AA, AB, AC, and AD obtained by this connection. A code corresponding to the symbol A is deleted from a code table. Therefore, the following two possibilities are introduced in coding of a finite number of symbol sequences or coding in which a symbol sequence is divided into blocks and then coded. The first possibility is that a code corresponding to a symbol sequence to be coded last is not present. The other possibility is that no code is output for the last symbol of a symbol sequence.

An operation of coding a symbol sequence B, A, C, and A by using the code table shown in FIG. 4 will be described. First, a code "0" corresponding to a symbol sequence B is output. Subsequently, a code "5" corresponding to a symbol AC is output. Therefore, a code corresponding to the last symbol A is not present.

Conventionally, the following method is adopted to solve the above problem. That is, on the coding side, in order to forcibly code and output the symbol A, a code (e.g., "5") corresponding to a symbol sequence (e.g., AC) including the symbol A is output. On the decoding side, the output symbols are counted, and the unnecessary symbol C is deleted. According to this method, therefore, the decoding side is required to have a circuit for counting symbols, and this enlarges the hardware.

In addition, in the conventional coding apparatus shown in FIG. 3, assuming that the number of bits of an input symbol is $N_{symbol}$ and the number of bits of a state is $N_{state}$, an address of each of the output table 110 and the state table 120 must have ($N_{symbol}+N_{state}$) bits. Therefore, an increase in the number $N_{symbol}$ of bits of an input symbol increases the capacities of both the output table 110 and the state table 120, and this in turn increases the hardware size of the coding apparatus. In some cases, the numbers of addresses of the output table 110 and the state table 120 may become too large to realize them.

As described above, since the necessary number or the necessary capacity of tables is increased in the conventional coding apparatus, the size of its hardware is also increased. In addition, the decoding side also has a problem that the size of hardware is increased in order to count symbols.

Furthermore, in the conventional coding method, a code which is used in coding at only a very low probability or is not used in it at all may be generated, and this causes a decrease in coding efficiency.

SUMMARY OF THE INVENTION

It is an object of the first aspect of the present invention to provide a coding apparatus capable of coding a plurality of information symbols, the number of which is not always constant, into code words each having a predetermined length before performing transmission/recording of the information, thereby solving problems of susceptibility to bit errors and difficulty in realization of circuits, and capable of expressing a given amount of information of an information source at a high efficiency before transmitting or recording it.

It is an object of the second aspect of the present invention to provide a coding apparatus capable of decreasing the sizes of hardware on both the coding and decoding sides.

It is an object of the third aspect of the present invention to provide a coding method capable of preventing generation of a code which has a very low generation probability or is not at all used in coding, thereby increasing the coding efficiency.

The first aspect of the present invention is characterized in that a coding means for assigning fixed-length codes to a plurality of information symbol sequences, the number of which is variable, i.e., not always constant, and coding symbolized information signals on the basis of this assignment is used to code the information signals, and the coded information signals are transmitted or recorded. More practically, the coding means performs code assignment such that fixed-length code words are generated for a plurality of combinations of information symbols consisting of variable number of codes obtained by compression-coding information signals.

According to the first aspect of the present invention, the use of code words each having a predetermined length makes it possible to perform establishment of word synchronization and decoding of the code words independently of each other. Therefore, this coding method is not easily affected by bit errors In addition, since a plurality of information symbols, the number of which is not always constant, are coded into fixed-length code words, a given amount of information of an information source can be efficiently expressed. That is, there is provided a coding apparatus which can eliminate the drawbacks of both the conventional variable-length coding and the fixed-length coding, which has a high reliability and a high efficiency, and which facilitates realization of its circuits.

The coding apparatus according to the second aspect of the present invention for coding symbol sequences consisting of a variable number of symbols by assigning fixed-length codes to the symbol sequences, is characterized by comprising a coding table for receiving input symbols and state signals as address inputs and outputting coded data, and a latch for holding the coded data output from this coding table.

In the coding apparatus according to the second aspect of the present invention, the size of the table required on the coding side can be decreased, and this decreases the hardware size on the coding side. In this apparatus, a code representing a symbol sequence held by the latch and currently being coded is forcibly output. This makes it unnecessary to use an apparatus for counting symbols to delete an unnecessary one, which is conventionally required on the decoding side. As a result, the hardware size on the decoding side is also decreased.

According to the second aspect of the present invention, the size of the table can be saved compared with conventional coding apparatuses. In addition, when symbol sequences are divided into blocks and then coded, the problem posed upon forced output of a symbol sequence coded last can be solved. Therefore, the sizes of hardware on both the coding and decoding sides can be decreased.

Another coding apparatus according to the second aspect of the present invention is characterized by comprising an input symbol converting means for converting an input symbol sequence into a plurality of new uniquely decodable symbol sequences, and a plurality of coding means, arranged to perform coding of a symbol sequence consisting of a variable number of symbols by assigning fixed-length codes to the symbol sequence, for independently coding the new symbol sequences obtained by the conversion performed by the input symbol converting means.

This arrangement may be modified such that new symbol sequences obtained by converting input symbol sequence are classified into symbol sequences to be nonfixed-length-coded and those to be fixed-length-coded before output. In this case, the symbol sequences to be nonfixed-length-coded are coded independently of each other by a plurality of nonfixed-length coding means arranged to perform coding of a symbol sequence consisting of a variable number of symbols by assigning fixed-length codes to the symbol sequence, and those to be fixed-length-coded are coded independently of each other by a plurality of fixed-length coding means.

According to this apparatus of the second aspect of the present invention, after an input symbol sequence is converted into a plurality of new uniquely decodable symbol sequences, these new symbol sequences are coded independently of each other by a plurality of coding means for performing coding of a symbol sequence consisting of a variable number of symbols by assigning fixed-length codes to the symbol sequence. Therefore, the capacity of a table required by the coding means can be decreased to reduce the size of hardware.

The coding method according to the third aspect of the present invention, wherein coding is performed by assigning fixed-length codes to input symbol sequences using a code table which is a set of pairs of a plurality of fixed-length codes and symbol sequences consisting of a variable number of symbols to be assigned with these codes, is characterized in that a plurality of symbol sequences obtained by connecting current symbol sequences present in the code table to a specific one of the current symbol sequences are grouped into a first symbol sequence having a maximum generation probability and a second symbol sequence consisting of the others, pairs of the first and second symbol sequences and codes corresponding to these symbol sequences are incorporated into the code table, and this operation is repeatedly performed until the number of codes in the code table reaches a predetermined number, thereby creating the code table.

In a preferred embodiment of the coding method according to the third aspect of the present invention, a conditional probability is used to obtain the generation probabilities of symbol sequences, and the obtained generation probabilities are used in grouping of the symbol sequences.

In performing coding of symbol sequences, a code table to be used to code a given symbol sequence is changed by using a code output immediately before.

The code table is designed by sorting the values of symbols in a descending or ascending order of the generation probabilities of the symbols or by establishing a predetermined relationship between the values of symbols and their generation probabilities. In performing coding of symbol sequences by using this code table, the value of the leading symbol of a symbol sequence to be coded is replaced by using a code output immediately before.

In the coding method according to the third aspect of the present invention, of a plurality of symbol sequences obtained by connecting current symbol sequences to a specific one of the current symbol sequences, those except for the first symbol sequence having a maximum generation probability are incorporated as a single symbol sequence (second symbol sequence) into the code table. Therefore, codes are assigned to symbols from the one having a higher probability of being used in actual coding. As a result, unlike in the conventional method in which all current symbol sequences are connected to a symbol sequence having a maximum generation probability and the obtained symbol sequences are incorporated into the code table, a code having a very small generation probability is not produced.

In this method, the number of codes in the code table is incremented by one each time symbol sequences are branched, i.e., each time new symbol sequences are added by the connecting/grouping operation. Therefore, a desired number of codes can be obtained more easily than in the case of the conventional method in which (the number of symbols−1) codes are added upon each branching operation. This makes it possible to effectively use all generated codes in coding of symbol sequences and in this manner enables code generation at a high coding efficiency.

In this case, a conditional probability may be used to obtain the probabilities of symbol sequences so that grouping of the symbol sequences is performed using the obtained probabilities. As a result, if a correlation is present in generation of symbols, information of this correlation can be used to realize code generation at a higher coding efficiency.

In coding of symbol sequences, a code table to be used to code a given symbol sequence is changed using a code output immediately before. Therefore, when a code including "others" is output in coding of a certain symbol sequence, all codes may be used in coding of the subsequent symbol sequence. Therefore, all of the codes can be effectively used, and this improves the coding efficiency.

In addition, the code table is designed by sorting the values of symbols in a descending or ascending order of the generation probabilities of the symbols or by establishing a predetermined relationship between the values of symbols and their generation probabilities. In performing coding of symbol sequences by using the code table thus designed, the value of the leading symbol of each symbol sequence is replaced by using a code output immediately before. As a result, when a code including "others" is output in coding of a given symbol sequence, the number of codes which are not at all used in coding of the subsequent symbol sequence can be reduced. Therefore, not only codes can be effectively used, but also only one type of a table is necessary in coding.

According to the third aspect of the present invention, therefore, there is provided a highly efficient coding method capable of solving the problem of the conventional coding method in that a code having a very low probability or not used in coding at all is generated.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 6 is a block diagram showing an example in which the first embodiment of the present invention is applied to an image transmitting/recording apparatus;

FIG. 7 is a table showing a process of coding three information symbols into 3-bit code words;

FIG. 8 is a view showing an example of a tree structure of symbol strings;

FIG. 9 is a table showing examples of obtained code words;

FIG. 10 is a view showing another example of a tree structure of symbol strings;

FIG. 12 is a table showing an example of the relationship between the code words and the information symbols shown in FIGS. 11A to 11E;

FIG. 13 is a table showing another example of the relationship between the code words and the information symbols shown in FIGS. 11A to 11E according to the present invention;

FIG. 14 is a block diagram showing a practical arrangement of a coding circuit shown in FIG. 5;

FIG. 15 is a block diagram showing the basic arrangement of a decoding circuit shown in FIG. 5;

FIG. 16 is a block diagram showing a more practical arrangement of the decoding circuit shown in FIG. 5;

FIGS. 17A to 17D are views showing examples of framing performed by a frame generating circuit shown in FIG. 5;

FIG. 20 is a flow chart for explaining procedures of assigning fixed-length codes according to a coding method of the second embodiment of the present invention;

FIGS. 22 and 23 are views showing an example of a correcting method used when the number of codes is "5" in FIG. 21;

FIG. 26 is a table showing an example of coding of symbol sequences according to the coding method of the second embodiment;

FIG. 27 is a block diagram showing a decoder side corresponding to the coding method of the second embodiment;

FIGS. 28A and 28B are views showing the contents of a pointer table, a table of the number of symbols, and a symbol table shown in FIG. 27;

FIG. 29 is a table showing a decoding example according to FIG. 27;

FIG. 30 is a table for explaining a code generating method according to a coding method of the third embodiment of the present invention;

FIG. 31 is a view showing a code table according to the coding method of the third embodiment of the present invention;

FIGS. 33A to 33C are views showing the contents of an output table, a state table, and a next table shown in FIG. 32;

FIG. 35 is a block diagram showing a decoder side corresponding to the coding method of the third embodiment;

FIGS. 36A and 36B are views showing the contents of a pointer table shown in FIG. 34;

FIGS. 37A and 37B are views showing the contents of a table of the number of symbols shown in FIG. 34;

FIGS. 38A and 38B are views showing the contents of a symbol table shown in FIG. 34;

FIG. 39 is a table showing a decoding example according to the third embodiment;

FIG. 40 is a table for explaining the number of effective codes of a code table according to the second embodiment of the present invention;

FIG. 41 is a table for explaining the number of effective codes of a code table according to the fourth embodiment of the present invention;

FIG. 42 is a view showing the contents of an output table and a state table according to the fourth embodiment;

FIG. 43 is a table showing a coding example of symbol sequences according to a coding method of the fourth embodiment;

FIGS. 45A and 45B are views showing the contents of tables shown in FIG. 44;

FIG. 46 is a table showing a decoding example according to the fourth embodiment;

FIG. 49 is a block diagram showing a coding apparatus according to the fifth embodiment of the present invention;

FIG. 50 is a view showing a code table in the fifth embodiment;

FIG. 51 is a view showing the contents of a coding table according to the code table shown in FIG. 50;

FIG. 52 is a table showing a coding example according to the fifth embodiment;

FIG. 55 is a view showing the contents of a coding table shown in FIG. 53, which is used when coding is performed in accordance with the code table shown in FIG. 54;

FIG. 58 is a view showing a conversion table used in the seventh embodiment;

FIG. 59 is a view showing a code table used in the seventh embodiment;

FIG. 60 is a view showing another code table used in the seventh embodiment;

FIG. 61 is a block diagram showing a coding apparatus according to the eighth embodiment of the present invention;

FIG. 62 is a view showing a conversion table used in the eighth embodiment;

FIG. 63 is a view showing a code table used in the eighth embodiment;

FIG. 64 is a view showing another code table used in the eighth embodiment; and

FIG. 65 is a block diagram showing another example of an input symbol converting circuit.

DETAILED DESCRIPTION OF THE PREFERRED EMBODIMENTS

Embodiments of the present invention will be described below with reference to the accompanying drawings.

Figure 1:
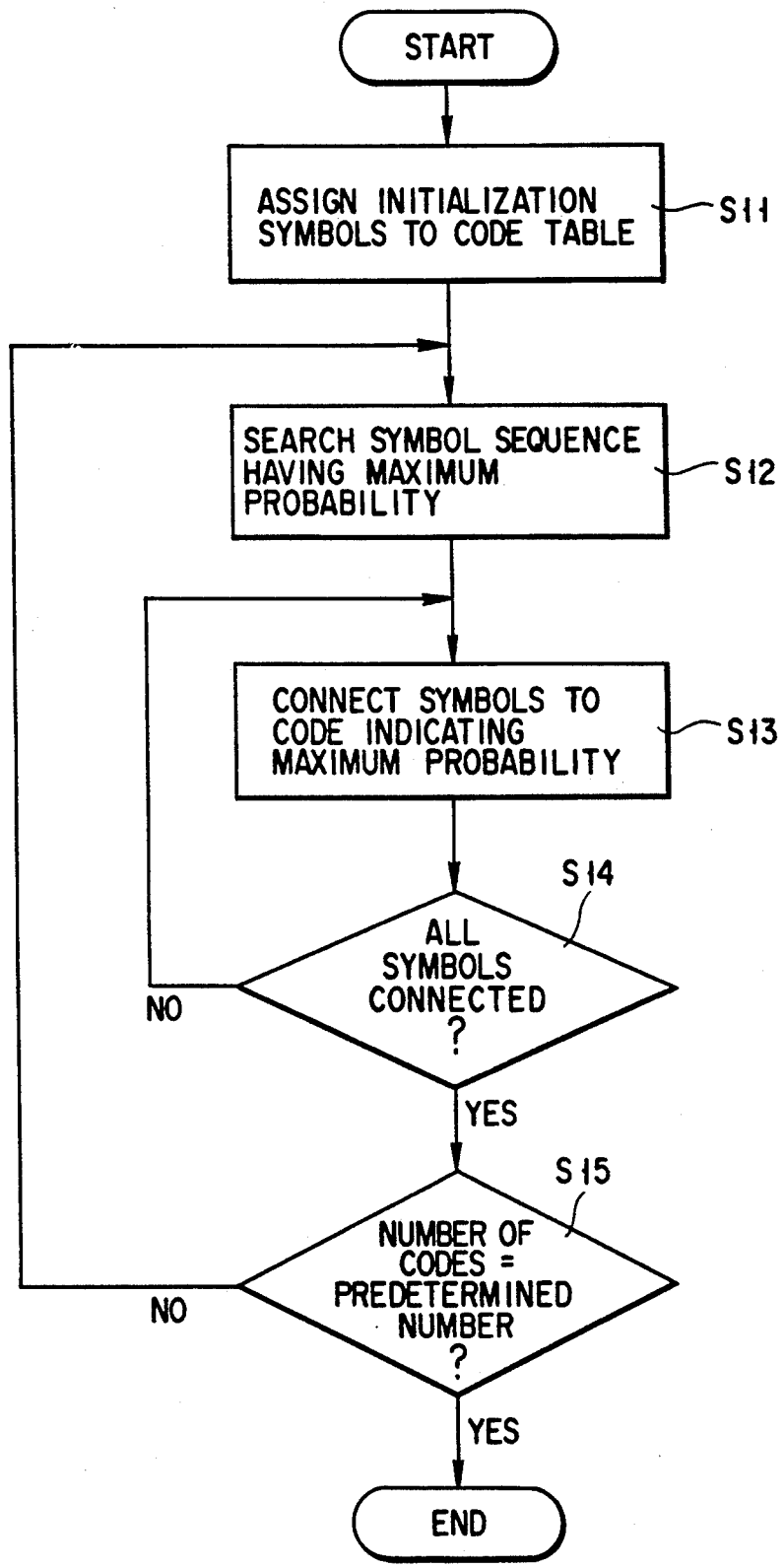
FIG. 1 is a flow chart for explaining procedures of assigning fixed-length codes in a conventional coding method.
Figure 2:
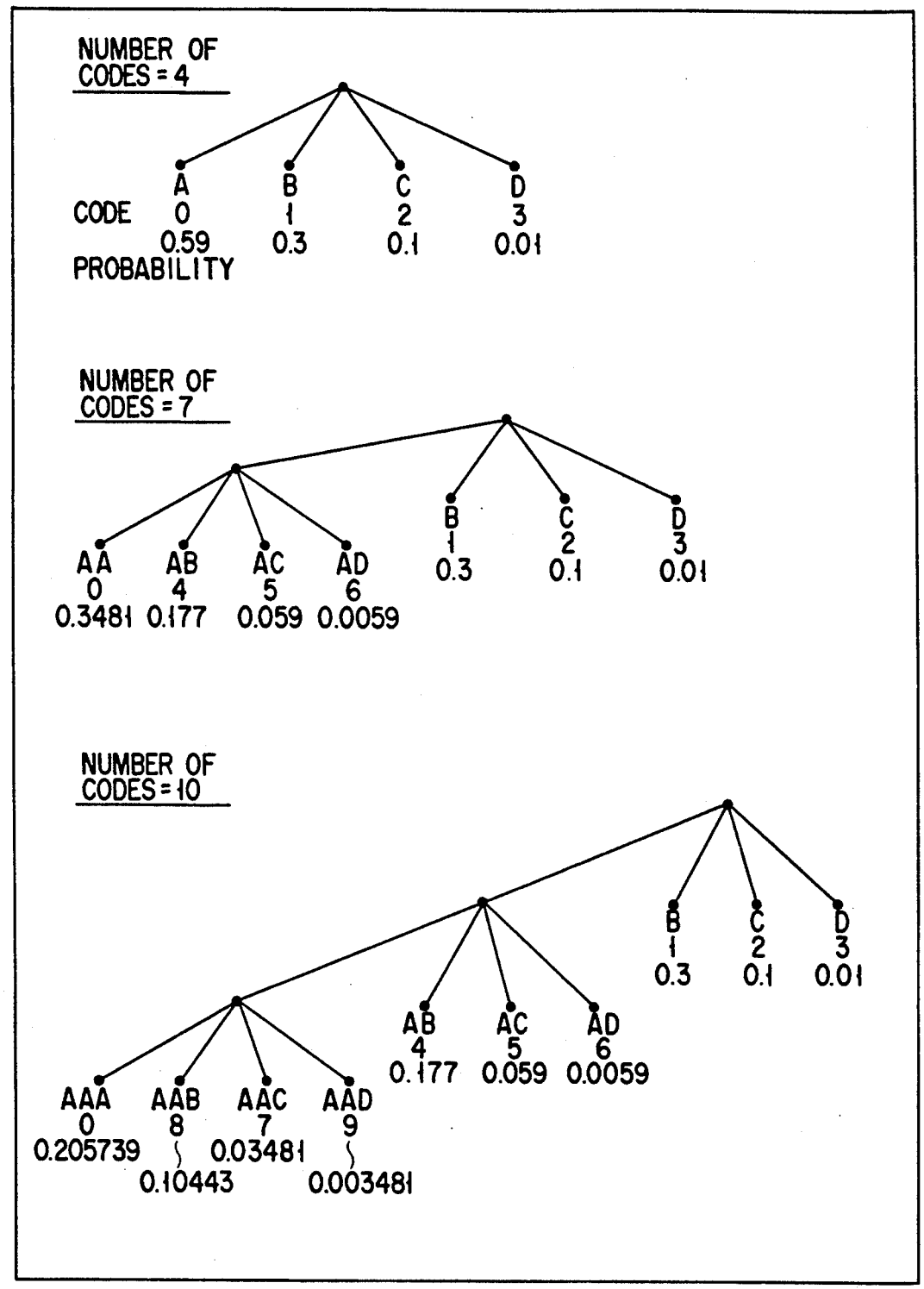
FIG. 2 is a view showing an example of fixed-length code assignment in the conventional coding method.
Figure 3:
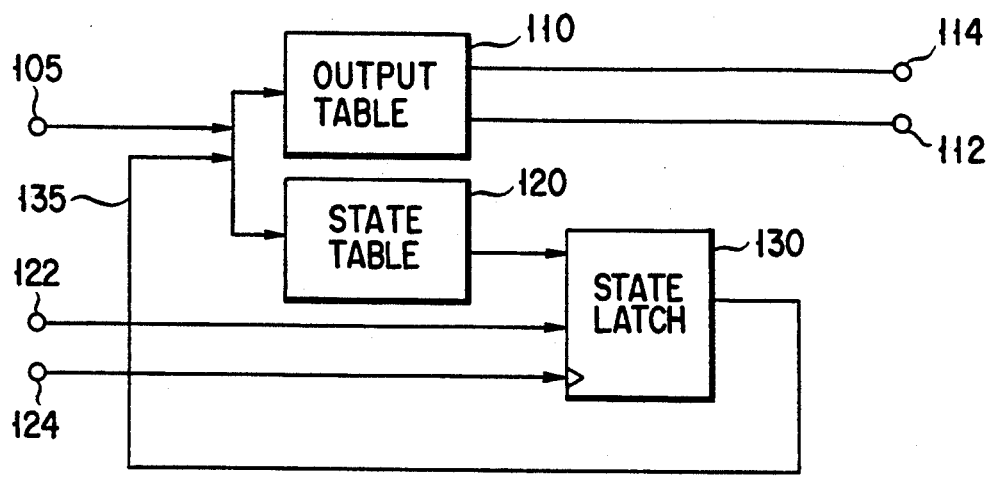
FIG. 3 is a block diagram showing a conventional coding apparatus.
Figure 4:
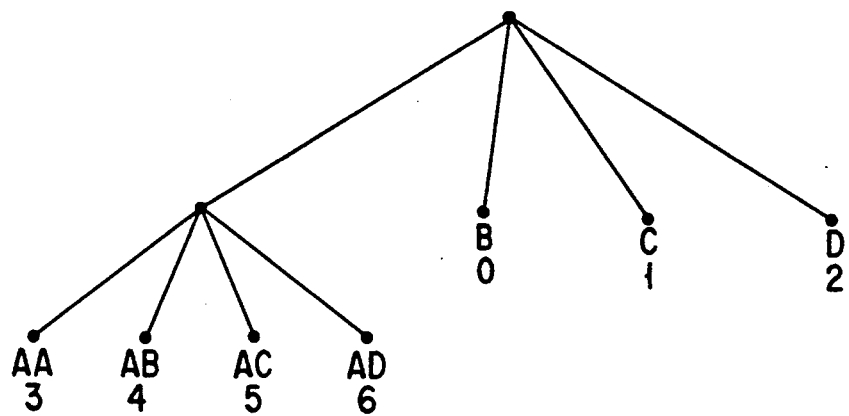
FIG. 4 is a view showing examples of codes designed by a conventional code designing method.
Figure 5:
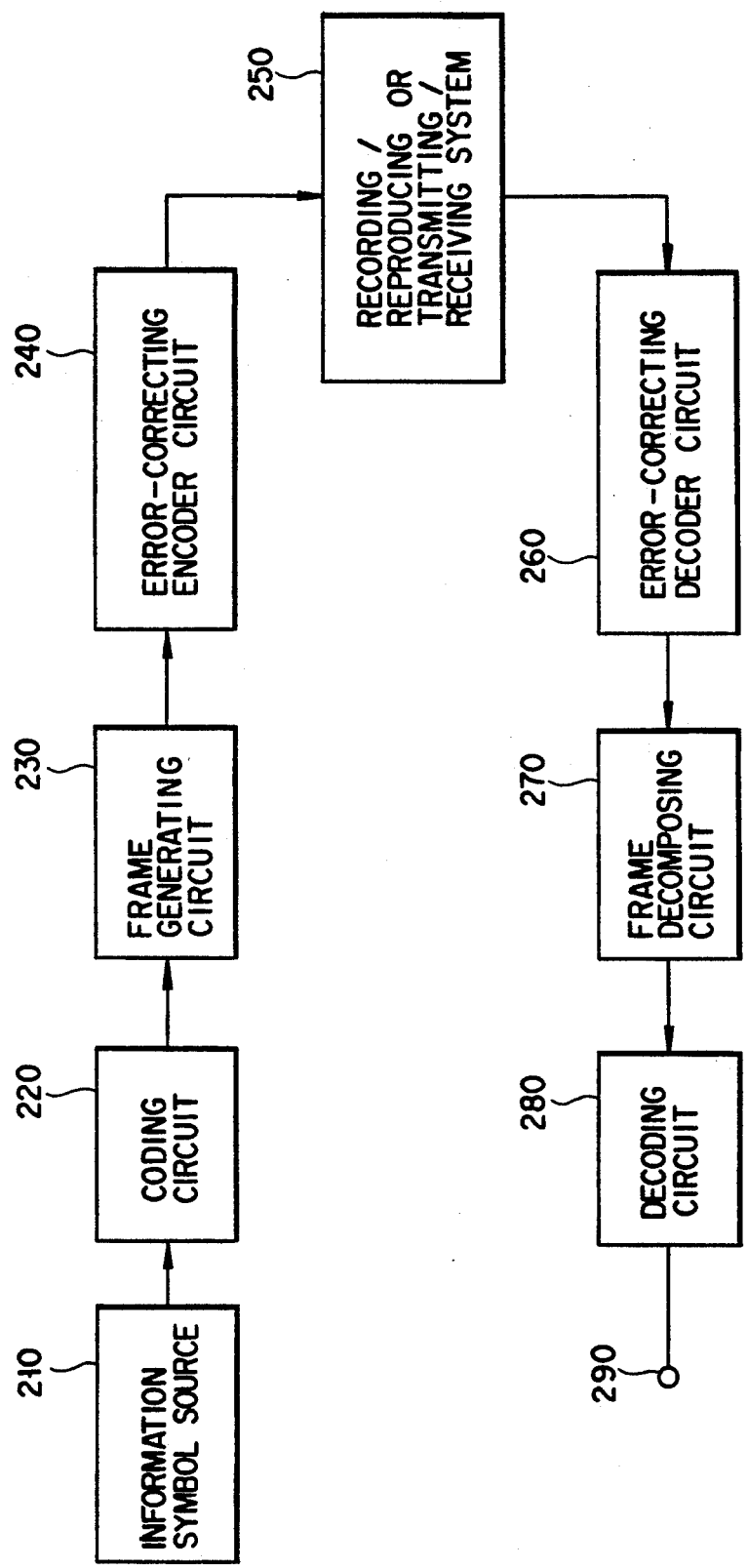
FIG. 5 is a block diagram showing a coding apparatus according to the first embodiment of the present invention.

FIG. 5 is a block diagram showing a coding apparatus according to the first embodiment of the present invention. Information symbols generated by an information symbol source 210 are coded by a coding circuit 220 as will be described later. Code words obtained by this coding are added with additional information and subjected to framing appropriate for transmission or recording by a frame generating circuit 230. In addition, in order to improve the reliability of the information, an error-correcting encoder circuit 240 adds error-correcting codes to the information. The resulting information is supplied to a recording/reproducing or transmitting/receiving system 250 and recorded or transmitted.

The information reproduced or received by the recording/reproducing o transmitting/receiving system 250 is subjected to error-correcting processing by an error-correcting decoder circuit 260, thereby correcting errors which occurred during transmission. The framed data string is output from the error-correcting decoder circuit 260 to a frame decomposing circuit 270, and each frame is decomposed into, e.g., the coded data and the additional information by the frame decomposing circuit 270. This coded data is decoded into the original information symbols by a decoding circuit 280 and output to a terminal 290.

FIG. 6 is a block diagram showing a practical arrangement in which images are recorded or transmitted particularly as information. The information symbol source 210 shown in FIG. 5 is constituted by an image input terminal 211 and an input processor 212. If an image signal input from the image input terminal 211 is an analog image signal, this analog signal is converted into a digital signal by the input processor 212. If an input image signal is a color image signal, a luminance signal and a color difference signal are sampled at different frequency ratios or same frequencies, or are time-multiplexed by the processor 212. A redundancy reducing circuit 215 is a circuit for reducing the redundancy of an image signal. More specifically, the circuit 215 has a function of generating information symbols by performing compression coding, such as predicative coding or orthogonal transform, e.g., DCT (Discrete Cosine Transform), and then performing quantization. Information symbols generated by the redundancy reducing circuit 215 are coded into code words by the coding circuit 220. Processing performed after the circuit 220 is similar to that explained above with reference to FIG. 5 and a detailed description thereof will be omitted.

The coding circuit 220 performs coding in accordance with a coding method of generating fixed-length code words for a plurality of information symbols, the number of which is not always constant. This coding method will be described below with reference to FIGS. 7 to 9.

FIG. 7 shows an example of a process of coding combinations of three information symbols S0, S1, and S2 generated at generation probabilities of 0.7, 0.2, and 0.1, respectively, into 3-bit code words.

S0, S1, and S2 are Huffman-coded to obtain the respective code lengths. Note that a simple method can be used as the method of obtaining code lengths by Huffman coding. In this example, a code length of 1 bit is obtained for S0, that of 2 bits is obtained for S1 and S2. The code lengths thus obtained for the information symbols are used to obtain symbol strings each having a sum of code lengths of 3 bits or less.

FIG. 8 shows an example of the symbol strings expressed as a tree structure. Referring to FIG. 8, a code word C0 corresponds to three successive S0's. A code word C1 corresponds to two successive S0's with an information symbol except S0, i.e., S1 or S2 which is represented by X in FIG. 8. In this manner, eight code words C0 to C7 are obtained. Of the nodes shown in FIG. 8, nodes (N0) to (N7) represent internal states, and some of them coincide with the code words.

FIG. 9 shows the code words obtained in FIG. 8. The code word C0 corresponds to three information symbols, and after these information symbols, one or two information symbols are similarly contained in a 3-bit code word. The code words C1, C5, and C7 correspond to the internal states (N3), (N5), and (N7), respectively, and the other code words return to the internal state (N0). For example, after C1 is output as a code word, if X is S1, the internal state transits to (N4); if X is S2, it transits to (N6).

The code words shown in FIG. 9 are merely examples, so other modifications may be made. In the tree structure of symbol strings shown in FIG. 8, the assignment of the code words can be changed by extending or merging the branches in accordance with the respective generation probabilities of the code words. For example, by further extending the branch of C0 while merging those of C6 and C7, a tree structure of symbol strings shown in FIG. 10 can be made. This assignment of code words is preferably trimmed such that the generation probabilities of the code words are almost equal to each other. It is also possible to add the generation probabilities of code words not returning to (N0) to the tree structure of FIG. 8, thereby forming a multistage tree structure. That is, since transition occurs to only a specific node at the internal states (N3), (N5), and (N7), a method of making a new tree structure on the basis of the probabilities of these code words is also possible.

The coding method will be described in more detail with reference to FIGS. 11A to 13.

FIGS. 11A to 11E show an example of a process of coding combinations of four information symbols S0, S1, S2, and S3, generated at generation probabilities of 0.5, 0.3, 0.19, and 0.01, respectively, into 4-bit code words. More specifically, FIGS. 11A to 11E show the process of finally obtaining 16 strings of information symbols (to be referred to as information symbol strings hereinafter) through four, five, seven, and eight information symbols.

Figure 11A:
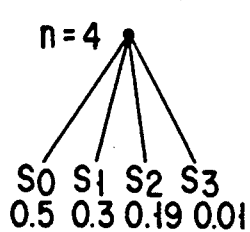
FIGS. 11A to 11E are views showing a process of coding four information symbols into 4-bit code words according to the present invention.
Figure 11B:
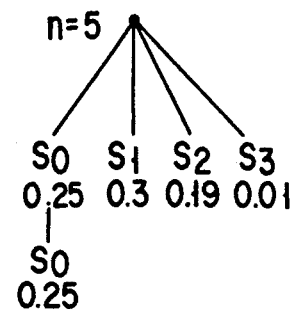
Figure 11C:
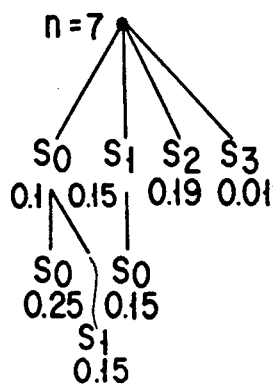
Figure 11D:
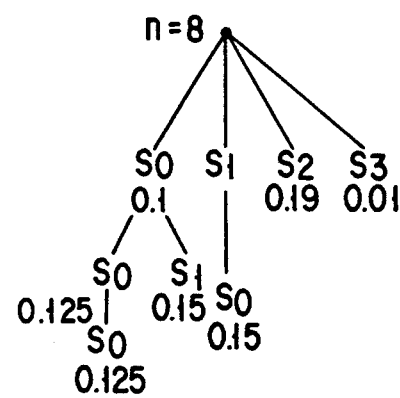
Figure 11E:
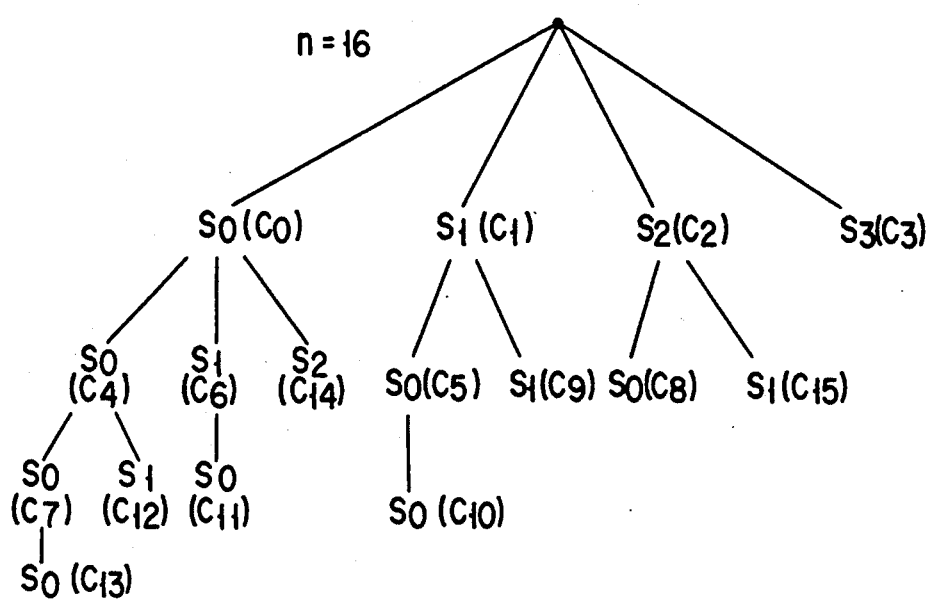

First, as shown in FIG. 11A, all the information symbols S0, S1, S2, and S3 are assigned to branches. Subsequently, after the information symbol S0 having the highest generation probability is assigned as shown in FIG. 11B, information symbols are assigned as shown in FIGS. 11C and 11D. Thereafter, a similar operation is repeatedly performed to finally obtain 16 information symbol strings. Lastly, 4-bit code words represented by {Cn} are assigned to these 16 information symbol strings. In the above operation, all information symbols to be branched next are not always indicated at the nodes of the individual branches. Therefore, a plurality of types of information symbol states can be present at the leading end of each branch. Assuming that this state is represented by X, the code word C1, for example, can be represented by S1X2 (X2 is either S2 or S3). In FIG. 11E, the code words C0, C1, C2, C5, C6, and C7 include other symbols represented by X.

A code word containing Xn is obtained once on the basis of an information symbol string before {Xn} appears. Subsequently, the state transits to an information symbol appearing as {Xn}, which is present in the front stage of {Xn}, and this determines the code word. That is, no code word is determined for an information symbol string containing {Xn} alone.

FIG. 12 shows the respective generation probabilities of code words C0 to C15 having 4-bit lengths of "0000" to "1111" and obtained by coding four information symbols S0, S1, S2, and S3 generated at generation probabilities of 0.5, 0.3, 0.19, and 0.01, respectively. Of the determined code words containing two or more information symbols, those having the lowest generation probabilities are C15 and C13 having probabilities of 0.057 and 0.0625, respectively. Therefore, when code words are to be excluded from assignment to information symbols, it is preferable to assign C15 and C13 to noncode words in this order.

A case wherein C15 is excluded from code word assignment will be considered. In the tree structure shown in FIG. 11E, C15 is merged with C2 as is apparent from the code assignment of the structure. In addition, C2 which is S2X2 in FIG. 12 is changed to S2X1 as shown in FIG. 13. This C15 excluded from the code word assignment is assigned to, for example, a unique word representing synchronization, as a control word for performing control.

FIG. 14 is a block diagram showing the arrangement of the coding circuit 220 shown in FIG. 5 for generating the code words described above. Information symbols generated by the information symbol source 210 are supplied to a code generator 221. The code generator 221, which is normally constituted by a read only memory (ROM) or a random access memory (RAM), outputs a code word and an internal state to terminals 225A and 225B, respectively. The internal state output to the terminal 225B is also supplied to a latch 222. This internal state is fed back as an immediately preceding internal state to the code generator 221 through the latch 222 after one time slot. If the code generator 221 is constituted by a ROM or an information symbol and an immediately preceding internal state are used as address inputs, and a code word and an internal state as outputs.

The coding performed by the apparatus shown in FIG. 14 will be described below by taking an operation performed when the codes shown in FIG. 9 are used as an example. Code words are effective when the internal state is (N0), (N3), (N5), or (N7). Therefore, an effective code word need only be extracted from the terminal 225A while the internal state is monitored through the terminal 225B. Alternatively, flags indicating whether code words are effective may be stored in the ROM or the RAM as the code generator 221 and output from another terminal. The code length of each code word is three bits in this embodiment, but it can be increased to a larger number of bits. Although exchange of code words can be performed either serially or parallelly, parallel exchange is more advantageous in terms of a circuit operation because the operation speed is low.

FIG. 15 is a block diagram showing an example of the basic arrangement of the decoding circuit 280 shown in FIG. 5. A code string is input to a code decoder 281 through a terminal 275. The code decoder 281 which is constituted by a ROM or a RAM decodes code words. The code words are decoded as follows. That is, if, for example, an input code word is the code word C0 shown in FIG. 9, the code decoder 281 decodes that C0 is constituted by three "S0"s. An information symbol generator 282 generates information symbols in accordance with the decoding result of the code decoder 281 and outputs the generated information symbols to a terminal 288. For example, if a code word supplied to the code decoder 281 is C0, the information symbol generator 282 successively generates and outputs three "S0"s.

FIG. 16 is a block diagram showing a more practical example of the decoding circuit 280. A string of code words input through the terminal 275 is temporarily written in a buffer memory 283. The code word string written in the buffer memory 283 is read out code by code and supplied to the code decoder 281 under the control of a memory read control circuit 284. The code decoder 281 decodes the readout codes. In accordance with the decoding result, the information symbol generator 282 generates information symbols and outputs the generated information symbols to the terminal 288.

When a necessary number of information symbols are generated, the string of code words is read out code by code again from the buffer memory 283 and supplied to the code decoder 281 by the memory read control circuit 284, and a similar operation is repeatedly performed.

The rate of code words will be considered below. In general, assuming that the code length is L bits, the transmission rate is C bits/sec., and the information symbol rate is S symbols/sec., the rate of code words is C/L symbols/sec., and a relation of C/L<S is satisfied. This is so because if this relation is not satisfied, high-efficiency coding is meaningless. The information symbol generator 282 need only perform generation of information symbols at a rate of S symbols/sec.

FIGS. 17A to 17D are views showing examples of framing performed by the frame generating circuit 230 shown in FIG. 5 Each of FIGS. 17A, 17B, 17C, and 17D shows an example of a frame format. The present invention also proposes a coding method in which some code words are excluded from assignment to information symbols and assigned as control words. Code words to be assigned to control words are preferably those having the lowest generation probabilities in the symbol string tree shown in FIG. 8 in order to obtain a high efficiency.

The individual areas constituting the frame shown in FIG. 17A will be described first.

A unique word is a control word for performing frame synchronization. When a noncode word area consisting of noncode words is formed in succession to the unique word, transmission of control information and the like can be performed. The size of this noncode word area may be either fixed or variable, or the noncode word area itself may be omitted as shown in FIG. 17D. In addition, a control area is a noncode word indicating the end of a code word area and can also be used as the unique word. If the size of the noncode word area is variable, it is preferable to arrange a parameter representing the size of the area in the start position.

A code word area is arranged after the unique word and the noncode word area shown in FIG. 17A. This code word area can be imparted a resistance against errors during frame transmission and is therefore preferably completed by a predetermined number of information symbols. For example, if an information signal is an image signal, it is possible to use one scan line or block as a unit of a predetermined number of information symbols.

In order to decode the data string framed as described above, the unique word is detected first to establish word synchronization. In this case, the size of the noncode word area is preferably an integer multiple of the word length of a code word because this facilitates the word synchronization. When synchronization of a fixed-length code word is established once, it is not disturbed after that.

Control words include, in addition to the one for performing frame synchronization, a word indicating the end of coded data. The control word indicating the end of coded data, which is useful when coding is stopped, is arranged after the code word area. In this case, for example, a condition is made in advance such that, if coding is stopped, the remaining information symbols are interpreted as a series of predetermined information symbols. This is effective in terms of coding efficiency.

The areas of the frame can also be arranged in an order of the unique word, the noncode word area, and the code word area (FIG. 17B). Since control information for controlling the code word area may be stored in the noncode word area, the noncode word area is arranged before the code word area in order to facilitate processing. Alternatively, the areas of the frame may be arranged in an order of the unique word, the noncode word area, and the control area (FIG. 17C).

The noncode word area will be described below. The size of the noncode word area may be either fixed or variable. When the size of the noncode word area is constantly fixed, the size of the area is preferably determined in advance. As a result, after the unique word is detected, the start position of the code word area is uniquely determined. When the size of the noncode word area is variable, the start position of the code word area cannot be determined after detection of the unique word. Therefore, in order to solve this problem, a parameter or the like representing the size of the area is added as information indicating the start position of the code word area.

The code word area is preferably completed by a predetermined number of information symbols so that the area is imparted a resistance against transmission errors. For example, if a signal is an image signal, one scan line or block can be used as a unit of a predetermined number of information symbols. In this case, the end of the frame can be confirmed by decoding of a predetermined number of information symbols. Therefore, even if an error occurs in the subsequent unique word, the frame synchronization is not disturbed. The use of a word indicating the end of coded data is exceptionally useful when coding is stopped, and this word is arranged after the code word area. For example, the word is effective in terms of coding efficiency when a condition is determined beforehand such that, if coding is stopped, the remaining information symbols is interpreted as a series of predetermined information symbols.

When the size of the noncode word area is an integer multiple of a code word, it is possible to effectively simplify the number of bits required for a parameter representing the size of the area and word synchronization in the code word area subsequent to the noncode word area.

It is also effective to set the word length of a code word to be an integer multiple of the code unit of an error-correcting code. For example, when the word length of a byte-correcting code represented by a Reed-Solomon code which is often used recently and the word length of a code word are set to establish a ratio of an integer multiple between them, synchronization of the code word can be substantially established after error correction even if transmission is performed bit-serially. If the word length of the byte-correcting code is longer than that of the code word, indefinite factors remain in correspondence with the integer multiple ratio. However, these indefinite factors can be perfectly removed by using a given number of unique words as described above in succession. A condition required for the unique word in this case is that, when a plurality of unique words are successively used, the same pattern is not included in other code word strings. For example, a word constituted by all "1"s or "0"s satisfies this condition.

Figure 18:
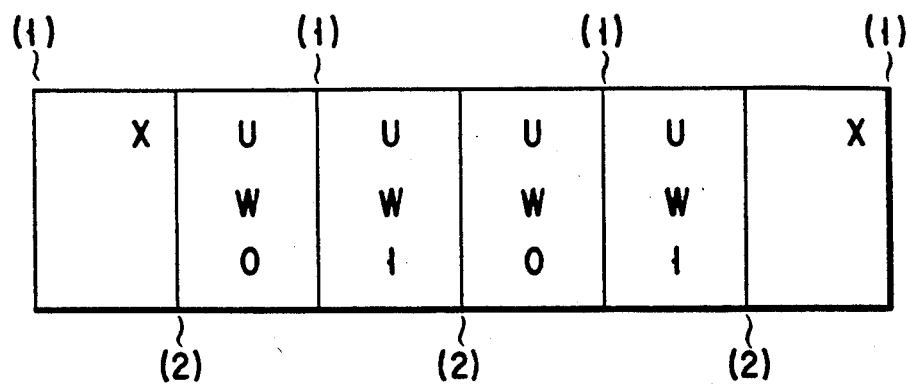
FIG. 18 is a view showing the format of a unique word for detecting synchronization according to the present invention.

A case wherein the word length of the code word is twice the length of the code unit of the error-correcting code will be described below with reference to FIG. 18.

The error-correcting decoder circuit 260 shown in FIG. 5 outputs the result of error-correcting processing. In this case, since the length of the code unit of the error-correcting code is half the word length of the code word, one code unit correspond to two code words. In FIG. 18, it is assumed that the unique word is represented by two words {UW0, UW1} as code units of the error-correcting code. Since synchronization of the code word is not established yet in the result of the error-correcting processing performed by the error-correcting decoder circuit 260, two possibilities of delimitation represented by (1) and (2) in FIG. 18 are present.

Conditions of correctly obtaining code word synchronization when a word string {X, UW0, UW1, UW0, UW1, X} including a unique word is output will be described below.

Assuming that {X, UW0} is a code word, no synchronization detection can be performed unless the next word {UW1, UW0} is detected as a unique word. Even if the order of UW0 and UW1 is reversed, UW0=UW1 must be satisfied in order that this word is detected as a unique word.

Erroneous detection of a unique word will now be considered. If a string {X, UW0, UW0, X} including one unique word is delimited into words {X, UW0} and {UW0, X}, no unique word can be detected. On the other hand, when words {X, UW0} and {UW0, X} are received in succession, a combination of {UW0, UW0} may be detected depending on the manner of delimitation, and this introduces a possibility of erroneous detection of a unique word. Therefore, one unique word alone cannot ensure correct synchronization detection, so two or more unique words must be used in succession.

More specifically, if a string is {X, UW0, UW0, UW0, UW0, X}, a unique word can be detected by either combination of {X, UW0}, {UW0, UW0}, and {UW0, X} or {UW0, UW0} and {UW0, UW0}, i.e., regardless of the manner of delimitation. As a result, it is possible to perform correct synchronization detection and eliminate a possibility of erroneous detection.

Figure 19:
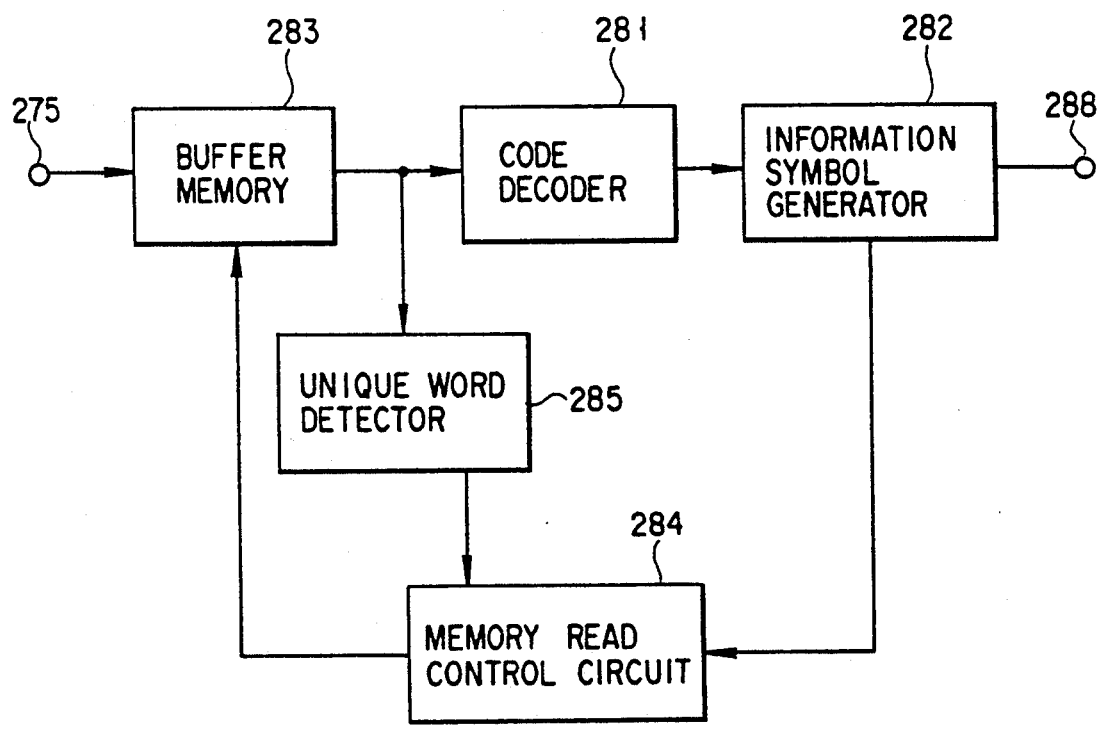
FIG. 19 is a block diagram showing a practical arrangement of a decoding circuit including synchronization detection according to the present invention.

FIG. 19 is a block diagram showing the arrangement of a decoding circuit having a synchronization detecting function. The circuit shown in FIG. 19 is obtained by additionally providing a unique word detector 285 to the decoding circuit shown in FIG. 16. A word string supplied to the terminal 275 is, for example, a code unit of an error-correcting code, and this word string is written in the buffer memory 283. Reading of code words from the buffer memory 283 is performed as follows. When word synchronization is not established yet, the unique word detector 285 performs unique word detection to correctly find the end of each word and informs the detection result to the memory read control circuit 284. After the word synchronization is established, the memory read control circuit 284 reads out code words one by one from the buffer memory 283. Once the word synchronization is established, it is not disturbed after that because fixed-length code words are used. The unique word detector 285 is also used in decoding of a frame format.

Figure 21:
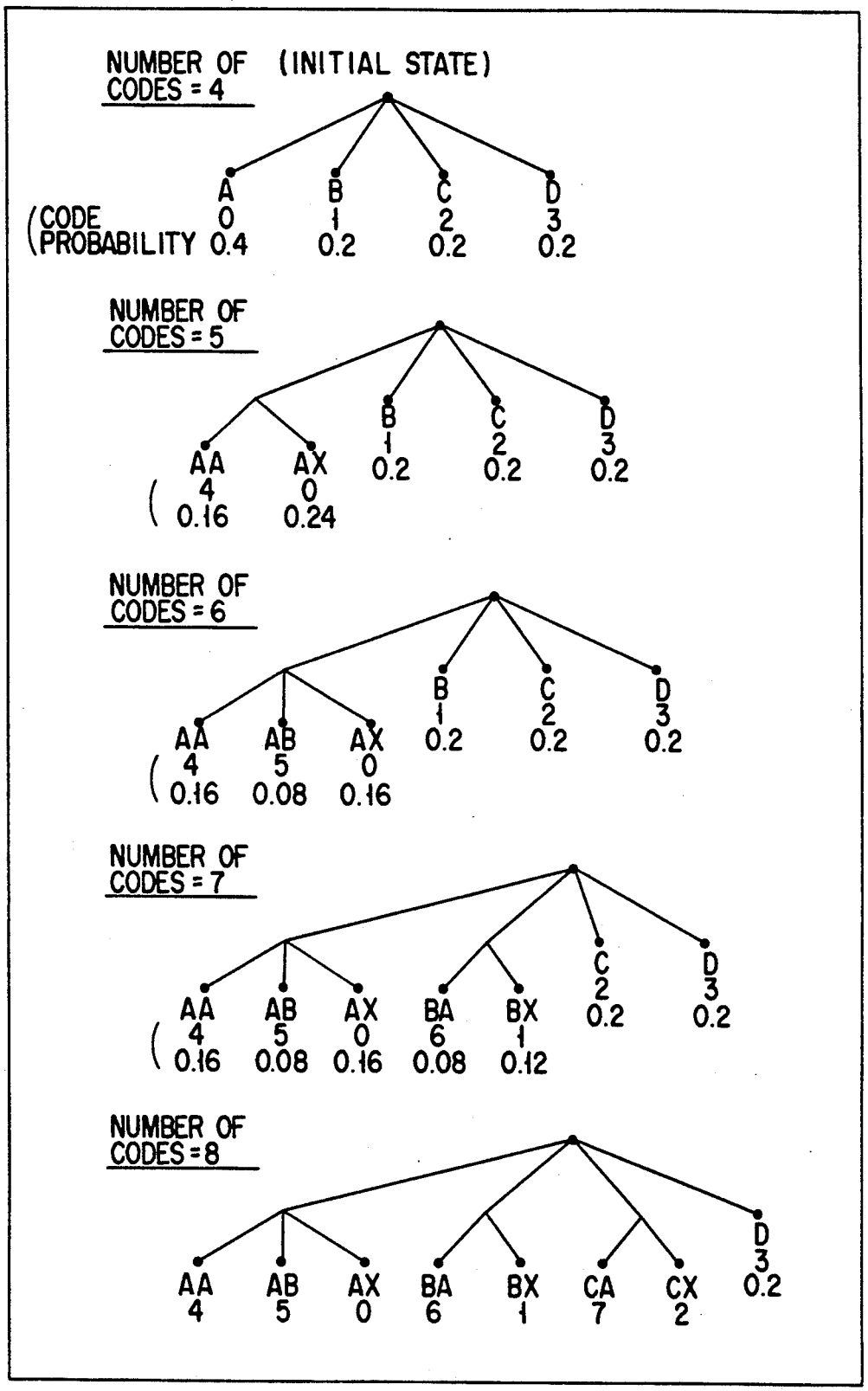
FIG. 21 is a view showing a practical example of fixed-length code assignment according to the second embodiment.

FIG. 20 is a flow chart for explaining the second embodiment of the present invention. This flow chart explains a method of assigning fixed-length codes to symbol sequences, in other words, a method of creating a code table. FIG. 21 shows the process of assignment shown in FIG. 20 as a tree structure.

Codes "0", "1", "2", and "3" are assigned to symbols (initialization symbols) A, B, C, and D for initialization (step S21). The number of codes in this state is "4".

A specific symbol sequence of the symbols A to D, in this case the symbol A corresponding to the code "0" indicating the maximum generation probability, is searched (step S22).

The symbols A, B, C, and D are connected to this symbol A to obtain new symbol sequences, and the obtained symbol sequences are grouped. That is, these symbol sequences are grouped into the symbol A indicating the maximum probability after the symbols A, B, C, and D are connected to the symbol A, and the "other" symbol X ($X \neq A$, $X = B$, C, D), and these grouped symbols are connected as AA (first symbol sequence) and AX (second symbol sequence) (steps S23 and S24).

The newly generated symbol sequences AA and AX are incorporated in the code table (step S25). As a result, the number of codes becomes "5".

Whether the number of codes has reached a predetermined number is checked (step S26). If the predetermined number is not reached, the flow returns to step S22, and connection and division of the next symbol sequence are performed in steps S23 and S24. That is, the code "0" having the maximum probability of the codes "0" to "4" is obtained, and the symbol sequence AX corresponding to this code "0" is divided. In this case, the symbol A corresponding to the code "0" is already divided once into AA and AX, and the code "0" is assigned to AX. Therefore, the "other" symbol sequence X ($X \neq A$, $X = B$, C, D) is divided into a symbol (B, for example, although B, C, and D have the same probability in FIG. 21) having the maximum probability and a new "other" symbol X ($X \neq A$, B, $X = C$, D), and the obtained symbols are connected and divided like AB and AX.

The symbol sequences are thus repeatedly connected and divided until a predetermined number of codes is reached, thereby creating the code table. With the above operation, the codes are assigned to the symbols from the one having the highest probability of being used in coding, so all of the codes are used in coding.

In order to further improve the coding efficiency, the generation probability of a code may be corrected by taking into account the influence of the "others" when the generation probability is obtained in order to connect and divide the symbol sequences. For example, when the number of codes is "5" in FIG. 21, the symbol A does not follow the code "0". In other words, the code "0" or "4" does not follow the code "0". Therefore, the probability of each code is corrected in consideration of this effect.

FIGS. 22 and 23 show an example of this correcting method at the time the number of codes is "5" in FIG. 21.

According to FIGS. 22 and 23, a probability that a code (state x) beginning with a given symbol transits to a code (state y) beginning with another given symbol is calculated first, and all transition probabilities are calculated. On the basis of these transition probabilities, the stationary probabilities of all states are calculated. The stationary probability of the given state x is divided in accordance with the magnitude of the probability of the code constituting the state x, thereby correcting the probability of the code.

The second embodiment of the present invention is not limited to the procedures of the flow chart shown in FIG. 20 but can be realized by other procedures. For example, in order to increment the number of codes by one, a symbol sequence corresponding to a code having the maximum probability need not be divided. Instead, a symbol sequence corresponding to a given code is divided to obtain a mean code length at that time, and this operation is performed for all codes. In this case, a symbol sequence corresponding to a code having the minimum mean code length is actually divided. These procedures are repeatedly performed until a predetermined number of codes is reached.

Figures 24, 25A, 25B:
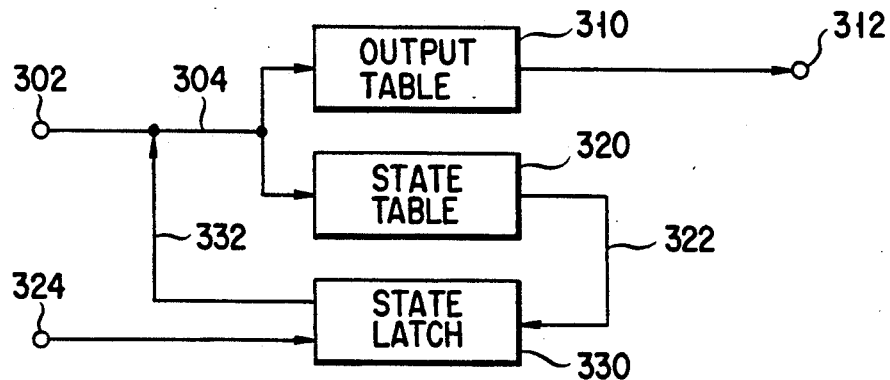
FIG. 24 is a block diagram showing an encoder side of a coding apparatus applied to the coding method of the second embodiment.
FIGS. 25A and 25B are views showing an example of a code table and the contents of an output table and a state table shown in FIG. 24.

FIG. 24 is a block diagram showing the encoder side of a coding apparatus applied to the coding method according to the second embodiment of the present invention. FIG. 25A shows an example of the code table, and FIG. 25B shows the contents of an output table 310 and a state table 320 shown in FIG. 24. FIG. 26 shows an example of coding of a symbol sequence B, C, A, . . . .

A state 332 is set to be "4" as its initial state by a state reset signal 324, and a symbol B is input to an input terminal 302. The state 332 and the input 302 are simultaneously supplied to an address 304 of the output table 310 and the state table 320. In accordance with the table contents shown in FIGS. 25A and 25B, the output table 310 does not output anything, and the state table 320 outputs "1" as a next state 322.

In response to the next clock, a state latch 330 latches the state "1", and a symbol C is supplied to the input terminal 302. When these inputs are simultaneously supplied to the address 304, a code "1" is obtained at an output terminal 312, and a state "2" is output to the state 322.

In response to the subsequent clock, the state latch 330 latches the state "2", and a symbol A is supplied to the input terminal 302. When these inputs are simultaneously supplied to the address 304, a code "7" is obtained at the output terminal 312, the initial state "4" is output to the state 322, and so forth. In this manner, coding is performed by repeatedly executing the state transition.

FIG. 27 is a block diagram showing the decoder side of the coding apparatus according to the second embodiment of the present invention. FIG. 28A shows the contents of a pointer table 410 and a table of the number of symbols 420, and FIG. 28B shows the contents of a symbol table 430. FIG. 29 shows an example of decoding of codes "1", "7", . . . .

A counter 440 is initialized to be "0" by a reset signal 448. When a code "1" is supplied to an input terminal 402, the pointer table 410 outputs a value "1" representing the start position of an address where a symbol corresponding to the code "1" is stored to a base address 412. The table of the number of symbols 420 outputs the number of symbol "1" to a comparator 450. An adder 460 adds an output "0" from the counter 440 and the value "1" of the base address 412 and supplies a sum output 462 to the symbol table 430. The symbol table 30 outputs a symbol B to an output terminal 432. At this time, the content of the counter 440 is incremented. The comparator 450 compares the value "1" of the table of the number of symbols 420 with the output from the counter 440. In this case, since the comparison result indicates a coincidence, the comparator 450 outputs a coincidence signal 452. The value of the counter 440 is initialized by this coincidence signal 452, and the coding apparatus of this embodiment requests an input of the next code.

When the next code "7" is supplied to the input terminal 402, the pointer table 410 outputs a value "10" indicating the start position of an address where a symbol corresponding to the code "7" is stored to the base address 412. The table of the number of symbols 420 outputs the number of symbols "2" to the comparator 450. The adder 460 adds the output "0" from the counter 440 and the value "10" of the base address 412 and supplies the sum output 462 to the symbol table 430. On the basis of the sum output 462, the symbol table 430 outputs a symbol C to the output terminal 432. The content of the counter 440 is incremented. The comparator 450 compares the value "2" of the table of the number of symbols 420 with the output from the counter 440. In this case, the comparison result indicates a noncoincidence, so the comparator 450 does not output the coincidence signal 452. In response to the next clock, therefore, the following operation is performed without receiving any code. The adder 460 adds the content "1" of the base address 412 and the content "1" of the counter 440 and supplies the sum output 462 to the symbol table 430. On the basis of the sum output 462, the symbol table 430 outputs a symbol A to the output terminal 432. The counter 440 is incremented. The comparator 450 compares the value of the table of the number of symbols 420 with the output from the counter 440. In this case, since the comparison result indicates a coincidence, the comparator 450 outputs the coincidence signal 452. The value of the counter 440 is initialized by this coincidence signal 452, the decoding apparatus of the present invention requests an input of the next code, and so forth. In this manner, codes are repeatedly input and decoded.

FIG. 30 is a table for explaining a code generating method in a coding method according to the third embodiment of the present invention. In this method, as shown in FIG. 30, a conditional probability is used to calculate the probabilities of codes. Therefore, when a correlation is present between symbols, the coding efficiency can be improved.

FIG. 31 shows a code table in the coding method according to the third embodiment of the present invention by taking the contents of the table shown in FIG. 25A as an example. Referring to FIG. 31, when coding is performed by using only TABLE 1, if a given code is a code containing a symbol of "others", e.g., a code "0", a symbol which appears next is only C or D. Therefore, a code which may be used is one of only three codes "2", "3", and "7" beginning with C or D.

For this reason, coding of a given code is performed by using TABLE 1 when the immediately preceding code does not contain a symbol of "others", TABLE 2 when it contains a symbol of "others" (B, C, D), and TABLE 3 when it contains a symbol of "others" (C, D). As a result, since the number of codes which may be used in coding of a given code is eight regardless of the immediately preceding code, the codes can be effectively used.

Figures 32, 34:
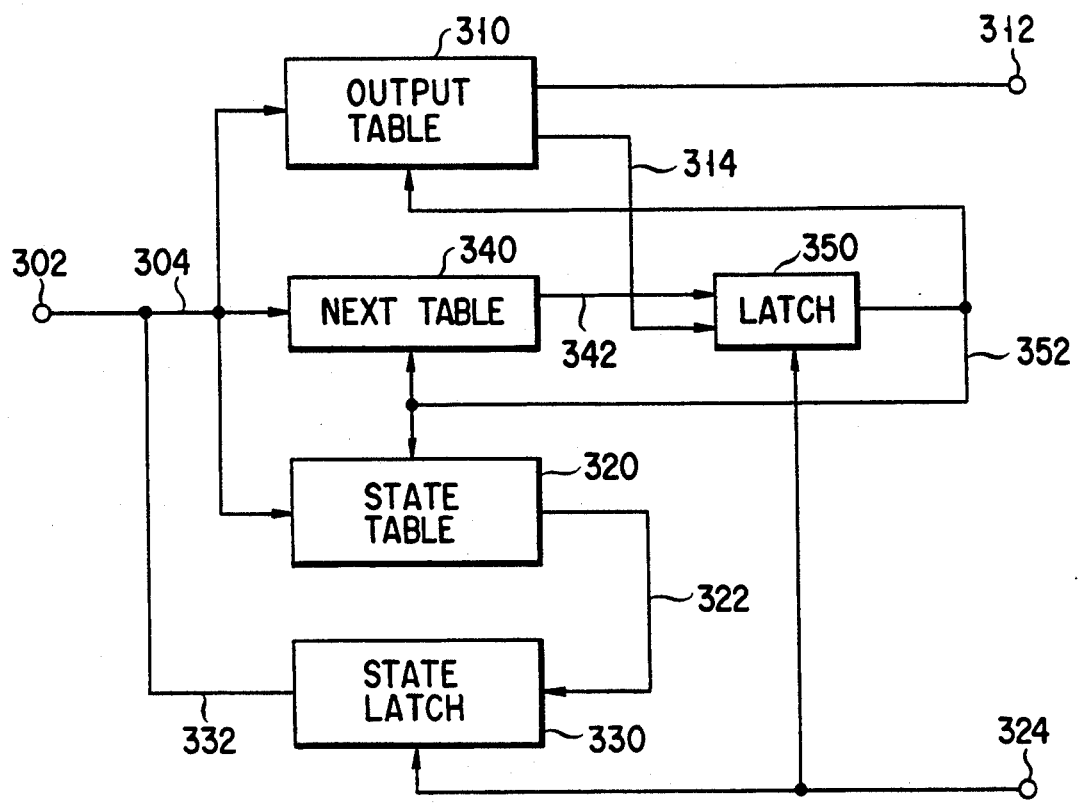
FIG. 32 is a block diagram showing an encoder side of a coding apparatus applied to the coding method of the third embodiment.
FIG. 34 is a table showing a coding example of symbol sequences according to the coding method of the third embodiment.

FIG. 32 is a block diagram showing the encoder side of a coding apparatus applied to the coding method of the third embodiment. FIGS. 33A to 33C show the contents of an output table 310, a state table 320, and a next table 340, respectively, which are obtained when coding is performed by using the code table shown in FIG. 31. FIG. 34 shows an example of coding of a symbol sequence B, C, A, . . . .

A state 332 is set to be an initial state "4" and a table number 352 is set to be "1" by a state reset signal 324. When a symbol B is supplied to an input terminal 302, the state 332 and the input 302 are simultaneously supplied to an address 304 of the output table 310 and the state table 320. As a result, in accordance with the tables shown in FIG. 33A, the output table 310 does not output anything, and the state table 320 outputs "1" as a next state 322.

In response to the next clock, a state latch 330 latches the state "1", and a symbol C is supplied to the input terminal 302. When these inputs are simultaneously supplied to the address 304, a code "1" is obtained at an output terminal 312, and the state "1" is output to the state 322. The next table 340 outputs the next table number "2" to an output line 342, and the output table 310 outputs a latch signal 314 for the next table number to a latch 350. The latch 350 latches the next table number "2" on the basis of the latch signal 314, and this switches the output table 310, the state table 320, and the next table 340 to those of the table number "2".

In response to the subsequent clock, the state latch 330 latches the state "1", and a symbol A is supplied to the input terminal 302. When these inputs are simultaneously supplied to the address 304, a code "5" is output to the output terminal 312, and the initial state "4" is output to the state 322. The next table 340 outputs the next table number "1" to the output line 342, and the output table 310 outputs the latch signal 314 for the next table number to the latch 350. The latch 350 latches the table number "1", this switches the output table 310, the state table 320, and the next table 340 to those of the table number "1", and so forth. In this manner, coding is performed while the state transition is repeatedly executed.

FIG. 35 is a block diagram showing the decoder side of the coding apparatus applied to the coding method of the third embodiment. FIGS. 36 to 38B show the contents of a pointer table 410, a table of the number of symbols 420, a symbol table 430, and a next table 470. FIG. 39 shows an example of decoding of codes "1", "5", . . . .

A counter 440 is initialized to be "0" and a table number latch 475 is initialized to be "1" by a reset signal 448. When a code "1" is supplied to an input terminal 402, the pointer table 410 outputs a value "1" indicating the start position of an address where a symbol corresponding to the code "1" is stored to a base address 412. The table of the number of symbols 420 outputs the number of symbols "1" to a comparator 450. The next table 470 outputs a decoding table number "2" for the next code. An adder 460 adds the output "0" from the counter 440 and the value "1" of the base address 412. A sum output 462 from the adder 460 is supplied to the symbol table 430, and the symbol table 430 outputs a symbol B to an output terminal 432. At this time, the counter 440 is incremented. The comparator 450 compares the value "1" of the table of the number of symbols 420 with the output from the counter 440. In this case, since the comparison result indicates a coincidence, the comparator 450 outputs a coincidence signal 452. In accordance with the coincidence signal 452, the value of the counter 440 is initialized, the table number latch 475 latches the value "2" of the next table 470, and an input of the next code is requested.

In response to the next clock, the table number "2" is set on the basis of the output from the next table 470. When a code "5" is supplied to the input terminal 402, the pointer table 410 outputs a value "7" indicating the start position of an address where a symbol corresponding to the code "5" is stored to the base address 412. The table of the number of symbols 420 outputs the number of symbols "2" to the comparator 450. The next table 470 outputs a decoding table number "1" for the next code.

The adder 460 adds the output "0" from the counter 440 and the value "7" of the base address 412 and supplies the sum output 462 to the symbol table 430. The symbol table 430 outputs a symbol C to the output terminal 432 on the basis of the sum output 462. The counter 440 is incremented. The comparator 450 compares the value "2" of the table of the number of symbols 420 with the output from the counter 440. In this case, the comparison result indicates a noncoincidence, so the comparator 450 does not output the coincidence signal 452. Therefore, no code is input in the subsequent clock cycle.

The adder 460 adds the content "7" of the base address 412 and the value "1" of the counter. The sum output 462 from the adder 460 is supplied to the symbol table 430 which in turn outputs a symbol A to the output terminal 432. The counter 440 is incremented. The comparator 450 compares the value of the table of the number of symbols 420 with the output from the counter 440. In this case, the comparison result indicates a coincidence, so that the comparator 450 outputs the coincidence signal 452. In accordance with the coincidence signal 452, the value of the counter 440 is initialized, the table number latch 475 latches the value "1" of the next table 470, an input of the next code is requested, and so forth. In this manner, coding of input codes is repeatedly performed.

FIG. 40 shows the number of effective codes in the code table according to the coding method of the second embodiment of the present invention, and FIG. 41 shows that of the fourth embodiment of the present invention. When symbols A, B, C, and D are arranged in a descending order, division of symbols is always performed in an order of A, B, C, and D. In general, a relation of (the number of codes beginning with symbol A)>(the number of codes beginning with symbol B)>(the number of codes beginning with symbol C)>(the number of codes beginning with symbol D) is satisfied.

The fourth embodiment uses the fact that if a given code contains "others", only a symbol represented by "others" appears as the leading symbol of the next code. More specifically, if "others" are C and D, the leading symbol A of the next code is replaced by C, and its leading symbol B is replaced by D. A code having C or D as its leading symbol is not used. With this operation, the number of effective codes is increased. For example, the numbers of effective codes of a given code at the time when the immediately preceding code does not contain "others", contains "others" B, C, and D, contains "others" C and D, and contains "others" D are 8→7→5→3 in the fourth embodiment shown in FIG. 41, while those of the second embodiment shown in FIG. 40 are 8→5→3→1. That is, the number of effective codes subsequent to a code containing "others" is increased.

The arrangement of the encoder side of a coding apparatus applied to the coding method of the fourth embodiment is the same as the block diagram shown in FIG. 24. In this embodiment, the contents of an output table 310 and a state table 320 are determined as shown in FIG. 42. Note that, in this embodiment, symbols A, B, C, and D are assigned to "0", "1", "2", and "3", respectively. FIG. 43 shows an example of coding of a symbol sequence "1", "2", "0", . . . .

A state 332 is set to be an initial state "4" by a state reset signal 324. When a symbol "1" is supplied to an input terminal 302, the state 332 and the input 302 are simultaneously supplied to an address 304 of the output table 310 and the state table 320. In accordance with the table contents shown in FIG. 43, the output table 310 does not output anything, and the state table 320 outputs "1" as a next state 322.

In response to the next clock, a state latch 330 latches a state "1", and "2" is supplied to the input terminal 302. These inputs are simultaneously supplied to the address 304. As a result, a code "1" is obtained at an output terminal 312, and the state "1" is output to the state 322.

In response to the subsequent clock, the state latch 330 latches the state "1", and "0" is supplied to the input terminal 302. When these inputs are simultaneously supplied to the address 304, a code "6" is obtained at the output terminal 312, the initial state "4" is output to the state 322, and so forth. In this manner, coding is performed by repeatedly executing the state transition.

Figure 44:
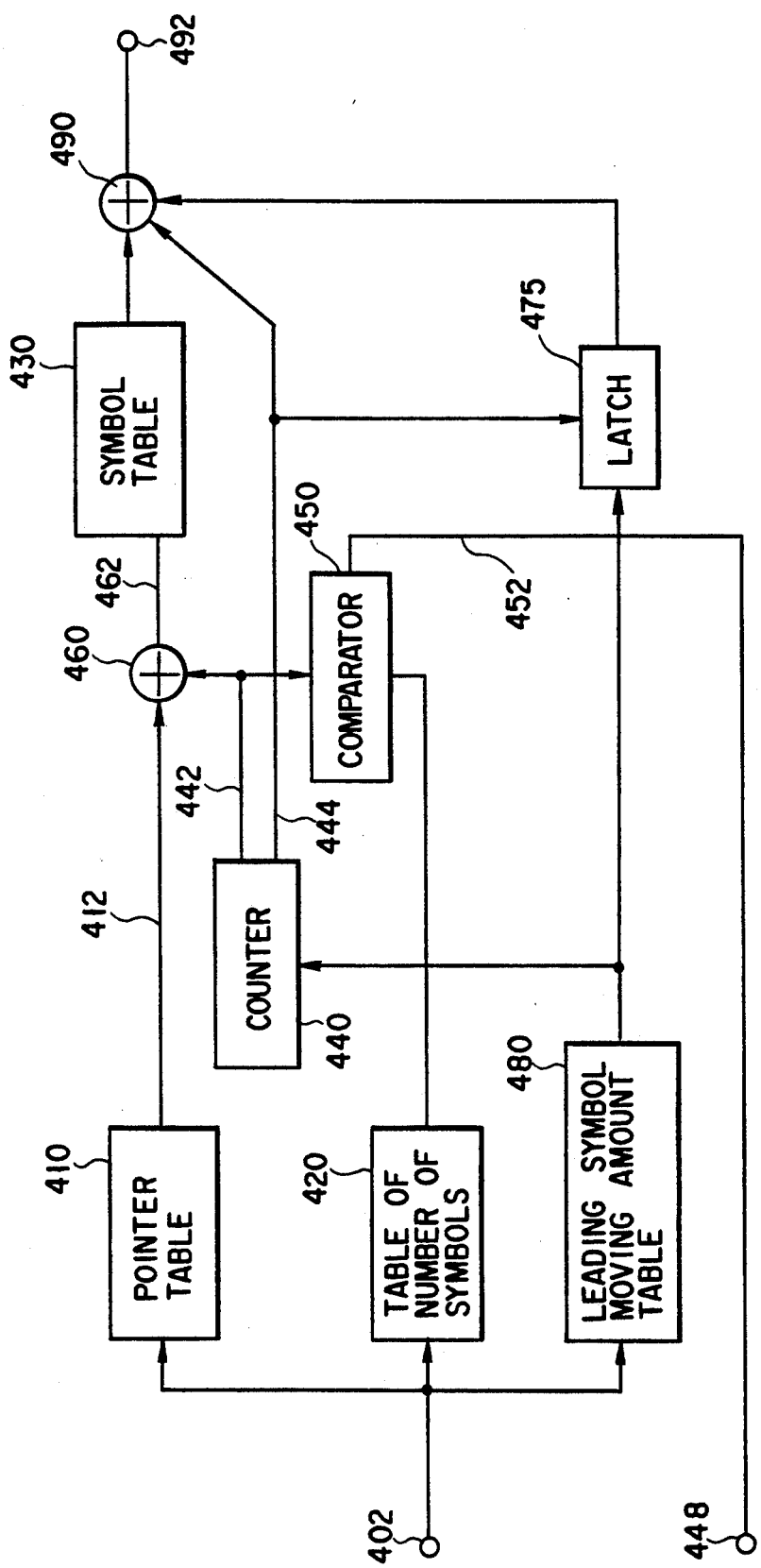
FIG. 44 is a block diagram showing a decoder side corresponding to the coding method of the fourth embodiment.

FIG. 44 is a block diagram showing the decoder side of the coding apparatus of the fourth embodiment. FIGS. 45A and 45B show the contents of a pointer table 410, a table 420 of the number of symbols, a symbol table 430, and a leading symbol moving amount table 480. FIG. 46 shows an example of decoding of codes "1", "6", . . . .

A counter 440 and a latch 475 are initialized to be "0" by a reset signal 448. When a code "1" is supplied to an input terminal 402, the pointer table 410 outputs a value "1" indicating the start position of an address where a symbol corresponding to the code "1" is stored to a base address 412. The table 420 of the number of symbols outputs the number of symbols "1" to a comparator 450. The leading symbol moving amount table 480 outputs a moving amount "1" of the leading symbol of the next code.

An adder 460 adds the value "0" of an output 442 from the counter 440 and the value "1" of the base address 412. A sum output 462 from the adder 460 is supplied to the symbol table 430, and the symbol table 430 in turn outputs the symbol "1" to an output terminal 432. When the output 442 from the counter 440 is "0", an addition signal 444 is output. In accordance with this addition signal 444, an adder 490 adds the value at the output terminal 432 and the content of the latch 475 and outputs the symbol "1" to an output terminal 492. At this time, the counter 440 is incremented. The comparator 450 compares the value "1" of the table 420 of the number of symbols with the output from the counter 440. In this case, since the comparison result indicates a coincidence, the comparator 450 outputs a coincidence signal 452. The value of the counter 440 is initialized by the coincidence signal 452, and an input of the next code is requested.

When a code "6" is supplied to the input terminal 402 in response to the next clock, the pointer table 410 outputs a value "8" indicating the start position of an address where a symbol corresponding to the code "6" is stored to the base address 412. The table 420 of the number of symbols outputs the number of symbols "2"

to the comparator 450. The leading symbol moving amount table 480 outputs the moving amount "0" of the leading symbol of the next code. The latch 475 latches the moving amount "1" of the immediately preceding leading symbol. The adder 460 adds the value "0" of the output 442 from the counter 440 and the value "8" of the base address 412. The sum output 462 from the adder 460 is output to the symbol table 430 which in turn outputs the symbol "1" to the output terminal 432.

When the output 442 from the counter 440 is "0", the counter 440 outputs the addition signal 444. In accordance with the addition signal 444, the adder 490 adds the value at the output terminal 432 and the content of the latch 475 and outputs the symbol "2" to the output terminal 492. The counter 440 is incremented. The comparator 450 compares the value "2" of the table 420 of the number of symbols with the output from the counter 440. In this case, the comparison result indicates a non-coincidence, so the comparator 450 does not output the coincidence signal 452. Therefore, no code is input in response to the subsequent clock.

The adder 460 adds the content "8" of the base address 412 and the value "1" of the counter. The sum output 462 from the adder 460 is supplied to the symbol table 430, and the symbol "0" is output to the output terminal 432 of the symbol table 430. Since the value of the counter 440 is "1", the addition signal 444 is not output. Therefore, the adder 490 does not perform addition and outputs the symbol "0" to the output terminal 492. The counter 440 is incremented. The comparator 450 compares the value of the table 420 of the number of symbols with the output from the counter 440. In this case, since the comparison result indicates a coincidence, the comparator 450 outputs the coincidence signal 452. The value of the counter 440 is initialized by the coincidence signal 452, an input of the next code is requested, and so forth. In this manner, codes are repeatedly input and decoded.

Figure 47:
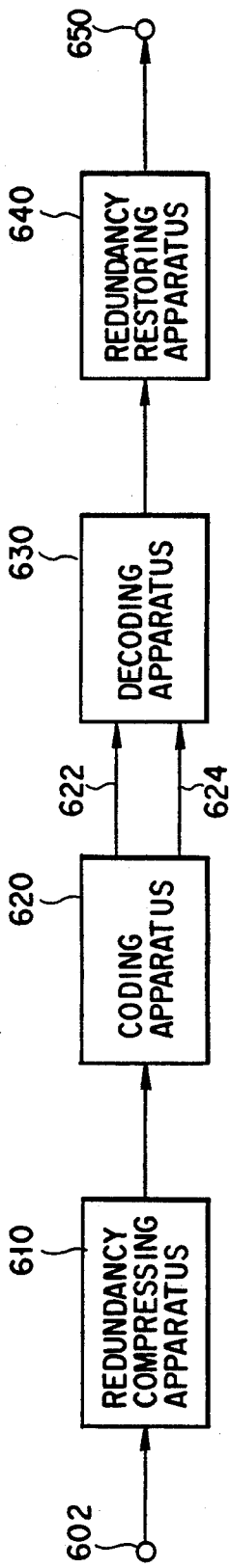
FIG. 47 is a block diagram showing an application example of the fourth embodiment.

FIG. 47 shows a coding/decoding system as an application example of the present invention. Referring to FIG. 47, when information (e.g., voice information or image information) is supplied to an input terminal 602, the redundancy of the information is compressed by a redundancy compressing apparatus 610. Thereafter, the information is supplied to a coding apparatus 620 according to the present invention and coded by the apparatus. The coded output is transmitted through a transmission path 622 or recorded in a recording medium 624. On the decoding side, the data transmitted through the transmission path 622 is received, or the data is read out from the recording medium 624. The received or readout data is decoded by a decoding apparatus 630. The decoded output is restored by a redundancy restoring apparatus 640, and the original information is supplied to an output terminal 650.

Figure 48:
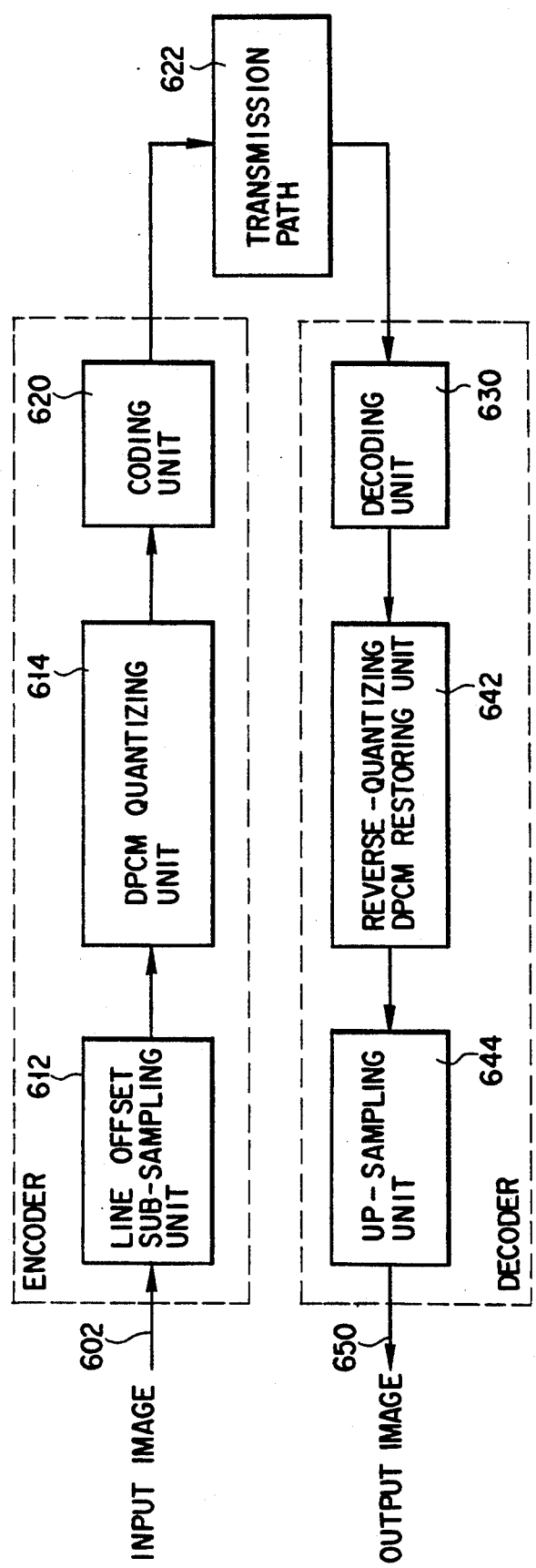
FIG. 48 is a block diagram showing another application example of the fourth embodiment.

FIG. 48 shows a more practical application example of the present invention in which the present invention is applied to a coding unit and a decoding unit of an HDTV signal coded. On the encoder side, image data supplied to an input terminal 602 is interlaced by a line offset sub-sampling unit 612. Thereafter, the redundancy of the data is compressed and the data is quantized by a DPCM quantizing unit 614. The quantized data is coded by a coding unit 620, and the coded data is transmitted to the decoder side through a transmission path 622. On the decoder side, the coded data supplied from the transmission path 622 is decoded by a decoding unit 630. A reverse-quantizing DPCM restoring unit 642 reverse-quantizes the data and restores its redundancy. An up-sampling unit 644 performs interpolation for the interlaced data and outputs the original image data to an output terminal 650. If the transmission path 622 is replaced with a recording medium such as a VTR tape, a magnetic disk, or an optical disk, this system can be applied to a storage-type system such as a VTR or a video disk player.

FIG. 49 is a block diagram showing a coding apparatus according to the fifth embodiment of the present invention. The contents of a coding table 360 are created by using a code table designed such that symbol sequences to which all connectable symbols are connected also remain in the coding table. FIG. 51 shows the contents of the coding table 360 at the time coding is performed in accordance with a code table shown in FIG. 50. FIG. 52 shows an example of coding of a symbol sequence B, A, C, A, D, . . . .

The content of a state latch 330 is set to be an initial state "8" using a reset signal 324. When a symbol B is supplied to an input terminal 302, the coding table 360 outputs a state "1" to a state 364 and a disable "1" to an output enable signal 362. When a clock 326 is input to the state latch 330, the state latch 330 latches the state "1".

When a symbol A is supplied to the input terminal 302, the coding table 360 outputs a state "6" to the state 364 and the disable "1" to the output enable signal 362. When the clock 326 is input to the state latch 330, the state latch 330 latches the state "6".

When a symbol C is supplied to the input terminal 302, the coding table 360 outputs a state "2" to the state 364 and an enable "0" to the output enable signal 362, thereby rendering a code "4" at an output terminal 334 effective. When the clock 326 is input to the state latch 330, the state latch 330 latches the state "2".

When the symbol A is supplied to the input terminal 302, the coding table 360 outputs a state "7" to the state 364 and the disable "1" to the output enable signal 362. When the clock 326 is input to the state latch 330, the state latch 330 latches the state "7".

When a symbol D is supplied to the input terminal 302, the coding table 360 outputs a state "3" to the state 364 and the enable "0" to the output enable signal 362, thereby rendering a code "7" at the output terminal 334 effective. When the clock 326 is input to the state latch 330, the state latch 330 latches the state "3", and so forth. In this manner, coding is performed by repeatedly executing the state transition.

In the code table shown in FIG. 50, the number of states is "9" when the number of codes is "8". Therefore, even when a code has a fixed length of three bits (the number of codes is "8"), data in the coding table 360 requires four bits (the number of states is "9"). In this case, "8" (three bits) can be obtained as the number of states if code design is performed by reducing the number of codes to "7". When the code length is large, almost no reduction is found in coding efficiency even if code design is performed by decrementing the number of codes by one in advance. When, for example, the code length is 12 bits, the degree of efficiency reduction is 4095/4096. Therefore, even when code design is performed by setting the number of codes to be (the power of $2-1$), a reduction in coding efficiency is not a problem on the practical level.

Figure 53:
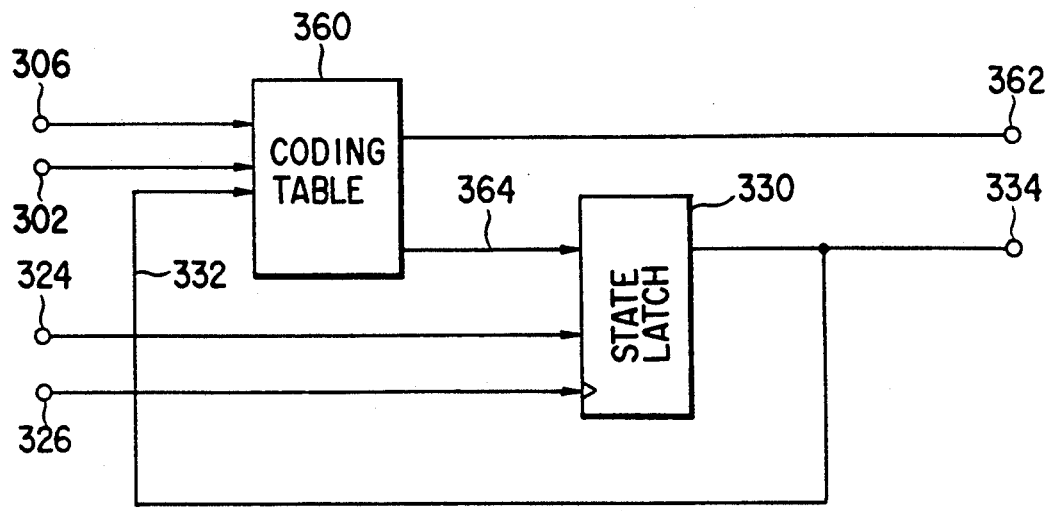
FIG. 53 is a block diagram showing a coding apparatus according to the sixth embodiment of the present invention.
Figure 54:
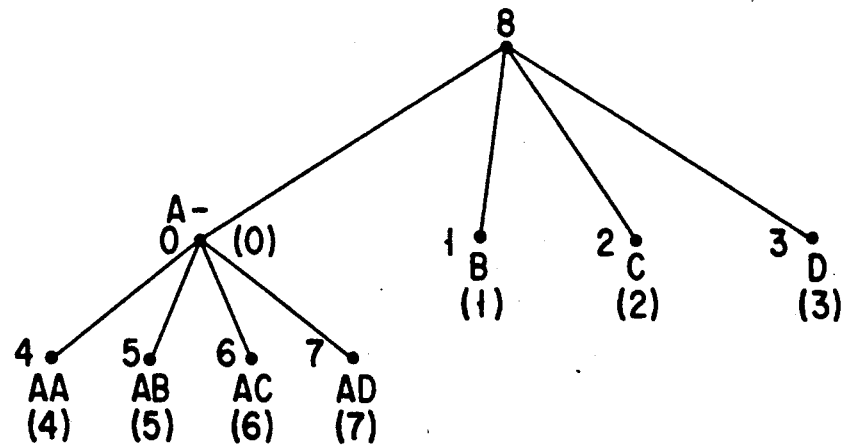
FIG. 54 is a view showing a code table for explaining the sixth embodiment.
Figures 56, 57:
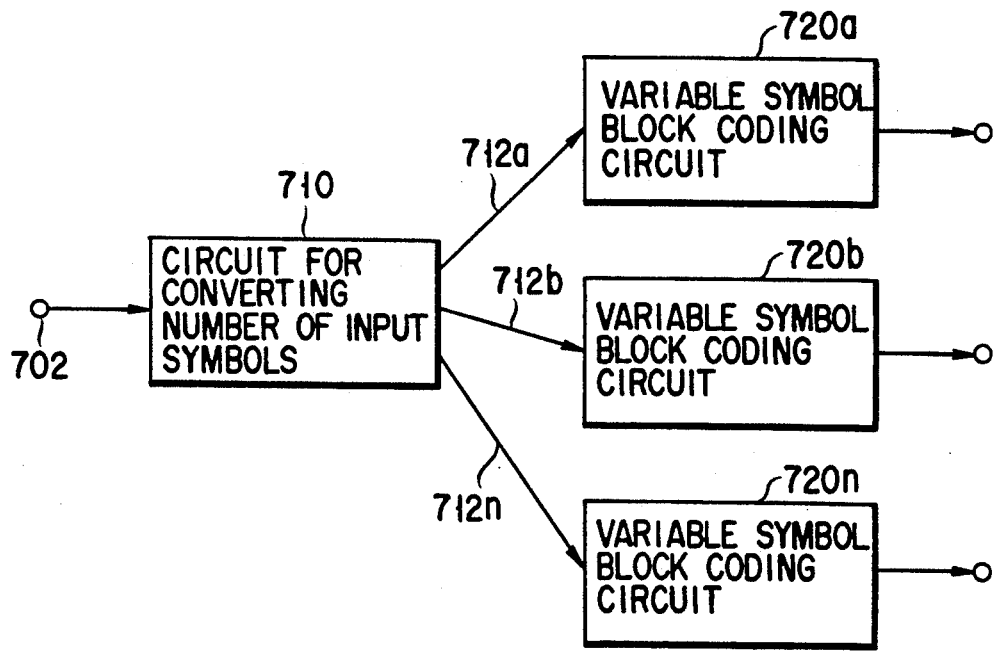
FIG. 56 is a table showing a coding example of symbol sequences according to the sixth embodiment.
FIG. 57 is a block diagram showing a coding apparatus according to the seventh embodiment of the present invention.

FIG. 53 is a block diagram showing a coding apparatus according to the sixth embodiment of the present invention. The contents of a coding table 360 are created by using a code table designed such that symbol sequences to which all connectable symbols are connected also remain in the coding table. FIG. 55 shows the contents of the coding table 360 at the time coding is performed in accordance with a code table shown in FIG. 54. FIG. 56 shows an example of coding of symbol sequences [B, A, C, A] and [D, . . .] Note that a symbol [*] indicates the end of each block.

The content of a state latch 330 is set to be an initial state "8" by using a reset signal 324. A symbol B is supplied to an input terminal 302. Since the symbol B is not the end of a block, "0" is supplied to a forced output terminal 306. Therefore, the coding table 360 outputs a state "1" to a state 364 and a disable "1" to an output enable signal 362. When a clock 326 is input to the state latch 330, the state latch 330 latches the state "1".

Subsequently, a symbol A is supplied to the input terminal 302. Since the symbol A is not the end of a block, "0" is supplied to the forced output terminal 306. Therefore, the coding table 360 outputs a state "0" to the state 364 and an enable "0" to the output enable signal 362, thereby rendering a code "1" of an output terminal 334 effective. When the clock 326 is input to the state latch 330, the state latch 330 latches the state "0".

A symbol C is supplied to the input terminal 302. Since the symbol C is not the end of a block, "0" is supplied to the forced output terminal 306. Therefore, the coding table 360 outputs a state "6" to the state 364 and the disable "1" to the output enable signal 362. When the clock 326 is input to the state latch 330, the state latch 330 latches the state "6".

Subsequently, the symbol A is supplied to the input terminal 302. Since the symbol A is not the end of a block, "0" is supplied to the forced output terminal 306. Therefore, the coding table 360 outputs the state "0" to the state 364 and the enable "0" to the output enable signal 362, thereby rendering a code "6" of the output terminal 334 effective. When the clock 326 is input to the state latch 330, the state latch 330 latches the state "0".

Since the block is ended after the symbol A is input, a forced output signal "1" is supplied to the forced output terminal 306. In accordance with this forced output signal "1", a leading symbol D of the next block is supplied to the input terminal 302, and the coding table 360 outputs a state "3" to the state 364 and the enable "0" to the output enable signal 362, thereby rendering the code "0" of the output terminal 334 effective. When the clock 326 is input to the state latch 330, the state latch 330 latches the state "3". In this manner, ["1", "6", "0"]["3", . . .] are obtained as the results of coding of the symbol sequences [B, A, C, A][D, . . .]. When these codes are decoded, the symbol sequences [B, A, C, A][D, . . .] are restored.

In situations where blocks are not successively input, the apparatus need not employ the arrangement shown in FIG. 53 provided that it includes a means for forcibly outputting a code representing a symbol currently being coded which is stored in the latch 330. For example, one of symbols (e.g., a symbol E) to be supplied to the input terminal 302 shown in FIG. 49 may be used as the signal for performing forced output. In this case, the symbol E is supplied to the input terminal 302 when the block is ended, thereby setting the output enable signal 362 to be the enable "0" and the state 364 to be the initial state "8". This makes unnecessary the use of the forced output terminal.

FIG. 57 is a block diagram showing a coding apparatus according to the seventh embodiment of the present invention. Symbols supplied to an input terminal 702 are converted into two or more (n) uniquely decodable symbols by a circuit 710 for converting the number of input symbols and supplied to a plurality of variable symbol block coding circuits 720a to 720n. Each of the variable symbol block coding circuits 720a to 720n performs coding of a symbol sequence consisting of a variable number of symbols by assigning fixed-length codes to the symbol sequence.

The operation of this coding apparatus will be described below by taking coding of a symbol sequence [4, 6, 10, 3, 0, 1, 2] as an example. The conversion performed by the circuit 710 for converting the number of input symbols uses an expression based on a remainder system or an expression based on a quotient and a remainder. FIG. 58 shows a conversion table for performing conversion using a remainder system (3, 5) when the number of symbols is 15. The circuit 710 for converting the number of input symbols converts input symbols into n symbols in accordance with this conversion table.

Of the n symbols converted by the circuit 710 for converting the number of input symbols in accordance with the conversion table shown in FIG. 58, when, for example, input symbols [4, 6, 10, 3, 0, 1, 2] are divided by [3], a remainder symbol sequence 712a is [1, 0, 1, 0, 1, 2]. This remainder symbol sequence 712a is input to the variable symbol block coding circuit 720a and coded into variable symbol block codes by this coding circuit. In this case, an address area of an internal coding table of the coding circuit 720a has ($N_{symbol1} + N_{state}$) bits.

FIG. 59 shows an example of a code table used in the variable symbol block coding circuit 720a. When the symbol sequence 712a [1, 0, 1, 0, 1, 2] is coded in accordance with this code table, [C5, C5, C4, C2] is obtained as the coding result.

Of the n symbols converted by the circuit 710 for converting the number of input symbols in accordance with the conversion table shown in FIG. 58, when input symbols [4, 6, 10, 3, 0, 1, 2] are divided by [5], a remainder symbol sequence 712b is [4, 1, 0, 3, 0, 1]. This symbol sequence 712b is input to the variable symbol block coding circuit 720b and coded into variable symbol block codes by this coding circuit. In this case, an address area of an internal code table of the coding circuit 720b has ($N_{symbol2} + N_{state}$) bits.

FIG. 60 shows an example of a code table used in the variable symbol block coding circuit 720b. When the symbol sequence 712b [4, 1, 0, 3, 0, 1] is coded in accordance with this code table, [D4, D7, D3, D6, D2] is obtained as the coding result.

Each of $N_{symbol1}$ and $N_{symbol2}$ are smaller than $N_{symbol}$ which is the number of bits of original input symbols. Therefore, it is possible to decrease the number of bits of the address area of the internal code table of each of the variable symbol block coding circuits 720a and 720b, and the circuit scale of the entire coding apparatus is reduced accordingly. This similarly applies to the other variable symbol block coding circuits 720c to 720n.

The outputs from the variable symbol block coding circuits 720a to 720n are transmitted or recorded through independent channels, or time-multiplexed and then transmitted or recorded. On the decoding side, the respective codes are decoded independently of each other, and the original symbols are restored by using a reverse-conversion table for performing reverse conversion of the conversion performed by the conversion table used in the circuit 710 for converting the number of input symbols.

FIG. 61 is a block diagram showing a coding apparatus according to the eighth embodiment of the present invention. Symbols supplied to an input terminal 702 are converted into two or more (m) uniquely decodable symbols by a circuit 710 for converting the number of input symbols and supplied to a variable symbol block coding circuit 720 or a fixed-length coding circuit 730. The variable symbol block coding circuit 720 performs coding such that fixed-length codes are assigned to a symbol sequence consisting of a variable number of symbols. The fixed-length coding circuit 730 performs coding such that fixed-length codes are assigned to symbols which are output from the circuit 710 for converting the number of input symbols and cannot be expected to be effectively coded by variable-length coding.

The operation of this coding apparatus will be described below by taking coding of a symbol sequence [4, 6, 10, 3, 0, 1, 2] as an example. In the conversion performed by the circuit 710 for converting the number of input symbols, an expression of a remainder system or an expression using a quotient and a remainder is used. FIG. 62 shows a conversion table for performing conversion using a quotient and a remainder of 4 when the number of symbols is 15. The circuit 710 for converting the number of input symbols converts input symbols into m symbols in accordance with this conversion table.

Of the m symbols converted by the circuit 710 for converting the number of input symbols in accordance with the conversion table in FIG. 62, when input symbols [4, 6, 10, 3, 0, 1, 2] are divided by [4], a symbol sequence 712a [1, 1, 2, 0, 0, 0] is obtained as the quotient. This symbol sequence 712a is input to the variable symbol block coding circuit 720 and coded into fixed-length codes by this coding circuit. In this case, an address area of an internal code table of the coding circuit 720 has ($N_{symbol3} + N_{state}$) bits.

FIG. 63 shows an example of a code table used in the variable symbol block coding circuit 720. When the symbol sequence 712a [1, 1, 2, 0, 0, 0] is coded in accordance with this code table, [E1, E1, E6, E7] is obtained as the result of coding.

Of the m symbols converted by the circuit 710 for converting the number of input symbols in accordance with the conversion table shown in FIG. 62, when input symbols [4, 6, 10, 3, 0, 1, 2] are divided by [4], a remainder symbol sequence 712i is [0, 2, 2, 3, 0, 1, 2]. This symbol sequence 712i is input to the fixed-length coding circuit 730 and coded into fixed-length codes by this coding circuit.

FIG. 64 shows an example of a code table used in the fixed-length coding circuit 730. When the symbol sequence [0, 2, 2, 3, 0, 1, 2] is coded in accordance with this coding table, [F0, F2, F2, F3, F0, F1, F2] is obtained as the result of coding.

$N_{symbol3}$ is smaller than $N_{symbol}$ as the number of bits of original input symbols. Therefore, the number of bits of the address area of the internal code table of the coding circuit 720 is decreased, and the circuit scale of the entire coding apparatus can be reduced accordingly.

The outputs from the coding circuits 720 and 730 are transmitted or recorded through independent channels, or time-multiplexed and then transmitted or recorded. On the decoding side, the respective codes are decoded independently of each other, and the original symbols are restored by using a reverse-conversion table for performing reverse conversion of the conversion performed by the conversion table used in the circuit 710 for converting the number of input symbols.

When input symbols are expressed by PCM data having a data width of a plurality of bits, the circuit for converting the number of input symbols used in each of the embodiments shown in FIGS. 57 and 61 can have an arrangement shown in FIG. 65. Referring to FIG. 65, symbols input from a terminal 802 are supplied to a quantizer 810 having comparatively coarse quantization characteristics. An output from this quantizer 810 is obtained as a first symbol string at a terminal 812. The output from the quantizer 810 is reverse-quantized by a reverse quantizer 820, and a difference with respect to the original symbols, i.e., an error with respect to the original symbols caused by a quantization error of the quantizer 810 is obtained by a subtracter 830. This difference is output as a second symbol string to a terminal 835.

The output from the terminal 835 may be further quantized. In this case, the output from the terminal 835 is input to a symbol converting circuit having the same arrangement as that of FIG. 65.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A coding apparatus for coding information signals symbolized to at least one of information symbols, comprising:

coding means for assigning fixed-length code words to a plurality of information symbol strings consisting of at least one type of a given number of said information symbols and outputting said fixed-length code words acquired on the basis of said assignment;

control information adding means for adding control information containing information for performing word synchronization; and transmitting/recording means including at least one of means for transmitting and means for recording said fixed-length code words added with said control information.

2. An apparatus according to claim 1, wherein said coding means includes:

code generating means for outputting a code word and a current self-internal state on the basis of said information symbols, and state latch means for receiving said self-internal state and feeding back said self-internal state to said code generating means after one time slot.

3. An apparatus according to claim 2, wherein said code generating means includes:

an output table for outputting a predetermined code word on the basis of said information symbols and said self-internal state output from said state latch means, and a state table for outputting, on the basis of the information symbols and said self-internal state output from said state latch means, a next internal state to said state latch means.

4. An apparatus according to claim 2, wherein said code generating means includes:
- a plurality of table groups, each of said table groups having
  - an output table for outputting a predetermined code word on the basis of said information symbols and said self-internal state output from said state latch means,
  - a state table for outputting, on the basis of said information symbols and said self-internal state output from said state latch means, a next internal state to said state latch means, and a next table for switching a table group to be referred to from one table group to another on the basis of said information symbols and said self-internal state output from said state latch means; and
- table latch means for latching the next table number output from said next table.

5. An apparatus according to claim 1, wherein said coding means includes:
- a coding table for outputting a self-state and an output enable signal on the basis of said information symbols, and
- state latch means for outputting said self-state latched before one time slot as a code word which is made valid by said output enable signal and latching said self-state in response to a clock signal.

6. An apparatus according to claim 1, wherein said control information adding means includes:
- means for adding a unique word for establishing word synchronization of said code word, and at least one of a noncode word area having control information and a control area indicating an end of coded data to said code word.

7. An apparatus according to claim 1, further comprising:
- receiving/reproducing means including at least one of means for receiving said code word added with said control information and transmitted by said transmitting means and means for reproducing said code word added with said control information and recorded by said recording means;
- frame decomposing means for decomposing said code word added with said control information into a control information and code words; and
- decoding means for decoding said code words obtained by said frame decomposing means into information symbols.

8. An apparatus according to claim 7, wherein said decoding means includes:
- means for decoding the code words, and
- means for generating information symbols on the basis of the decoding result of the code words.

9. An apparatus according to claim 7, wherein said decoding means further includes:
- a buffer memory in which strings of code words are temporarily written, and from which a predetermined number of code words are read out and supplied to said code decoding means, and
- a memory read control circuit for controlling the number of code words to be read out from said buffer memory.

10. An apparatus according to claim 7, wherein said decoding means includes:
- a pointer table for outputting a starting address in accordance with said code word,
- a table of the number of symbols for outputting the number of information symbols in accordance with said code word,
- a counter, reset by a predetermined input signal, for incrementing a stored value each time a code word is input,
- a comparator for comparing the output from said table of the number of symbols with the output from said counter and outputting a predetermined signal to said counter on the basis of the comparison result,
- an adder for adding said starting address output from said pointer table and an output from said counter and outputting the addition result, and
- a symbol table for outputting information symbols on the basis of the addition result from said adder.

11. An apparatus according to claim 10, wherein said decoding means further includes:
- a plurality of table groups, each of said table groups having said pointer table, said table of the number of symbols, and a next table for outputting a next table number for selectively using said table groups on the basis of a predetermined input, and
- a latch for latching the next table number output from said next table.

12. An apparatus according to claim 10, wherein said decoding means further includes:
- a leading symbol moving amount table for outputting a moving amount of a leading symbol of a code word in accordance with an immediately preceding code word,
- a latch for latching the moving amount output from said leading symbol moving amount table on the basis of the output from said counter, and
- a second adder for adding the output from said table of the number of symbols and the output from said latch on the basis of the output from said counter and outputting the addition result.

13. A coding apparatus for coding symbolized information signals, comprising:
- input symbol converting means for converting a first information symbol string consisting of information symbols into a plurality of new uniquely decodable second information symbol strings by using an expression including one of an expression based on a remainder system and an expression based on a quotient and a remainder; and
- a plurality of coding means, arranged corresponding to said second information symbol strings, each of said coding means inputting a corresponding one of said second information symbol strings and assigning a fixed-length code word to said corresponding second information symbol string.

14. A coding apparatus for coding symbolized information signals, comprising:
- input symbol converting means for converting a first information symbol string consisting of information symbols into a plurality of new uniquely decodable information symbol strings including second information symbol strings to be nonfixed-length-coded and third information symbol strings to be fixed-length-coded, and outputting said second and third information symbol strings;
- a plurality of nonfixed-length coding means, arranged corresponding to said second information symbol strings, each of said nonfixed-length coding means inputting a corresponding one of said second information symbol strings and assigning a fixed-length code word to said corresponding second information symbol string; and a plurality of fixed-length coding means arranged corresponding to said third information symbol strings, each of said fixed-length coding means inputting a corresponding one of said corresponding third information symbol strings and assigning a fixed-length code word to said corresponding third information symbol string.

15. A coding method of coding information symbol strings by assigning fixed-length codes to the pairs of a plurality of fixed-length codes and information symbol strings consisting of a variable number of information symbols to be assigned with the fixed-length codes, comprising the steps of:

grouping a plurality of information symbol strings, obtained by connecting current information symbol strings present in said code table to a specific one of the current information symbol strings, into a first information symbol string having a maximum generation probability and a second information symbol string consisting of the other information symbol strings; and repeatedly performing an operation of incorporating pairs of the first and second information symbol strings and corresponding codes in said code table until the number of codes in said code table reaches a predetermined number, thereby updating said code table.

16. A coding method of coding information symbol strings by assigning fixed-length codes to the information symbol strings by using a code table as a set of pairs of a plurality of fixed-length codes and information symbol strings consisting of a variable number of information symbols to be assigned with the fixed-length codes, comprising:

a first step of connecting a specific information symbol string of current information symbol strings present in said code table to a given information symbol of the current information symbol strings such that a maximum generation information symbol strings such that a maximum generation probability is obtained after the connection, thereby obtaining a first information symbol string;

a second step of connecting the specific information symbol string to information symbols of the current information symbol strings except the information symbol connected in the first step, thereby obtaining a second information symbol string;

a third step of incorporating pairs of the first and second information symbol strings obtained in the first and second steps and corresponding codes in said code table; and a fourth step of repeating the operations of the first to third steps until the number of codes in said code table reaches a predetermined number, thereby updating said code table.

17. A method according to claim 16, wherein the first step includes a substep of preparing a plurality of tables, and the third step includes a substep of incorporating pairs of the first and second information symbol strings obtained in the first and second steps and corresponding codes in said code table in accordance with a predetermined priority order assigned to said plurality of tables.

18. A coding method of coding information symbol strings by assigning fixed-length codes to the information symbol strings by using a code table as a set of pairs of a plurality of fixed-length codes and information symbol strings consisting of a variable number of information symbols to be assigned with the fixed-length codes, comprising:

a first step of dividing an information symbol string corresponding to a given code into two information symbols and obtaining mean code lengths of all codes;

a second step of dividing an information symbol string corresponding to a code having a minimum mean code length in said mean code lengths obtained in said first step into two information symbols; and a third step of repeatedly performing the operations of the first and second steps until the number of codes reaches a predetermined number, thereby updating said code table.

* * * * *